(12) United States Patent
Kato et al.

(10) Patent No.: US 9,702,043 B2
(45) Date of Patent: Jul. 11, 2017

(54) SUBSTRATE PROCESSING APPARATUS

(71) Applicant: Tokyo Electron Limited, Tokyo (JP)

(72) Inventors: Hitoshi Kato, Iwate (JP); Katsuyuki Hishiya, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 616 days.

(21) Appl. No.: 13/859,803

(22) Filed: Apr. 10, 2013

(65) Prior Publication Data

US 2013/0276705 A1 Oct. 24, 2013

(30) Foreign Application Priority Data

Apr. 19, 2012 (JP) .................................. 2012-095779

(51) Int. Cl.
| | | |
|---|---|---|
| *C23C 16/00* | (2006.01) | |
| *C23C 16/458* | (2006.01) | |
| *C23C 16/46* | (2006.01) | |
| *C23C 16/44* | (2006.01) | |

(52) U.S. Cl.
CPC ...... *C23C 16/4584* (2013.01); *C23C 16/4401* (2013.01); *C23C 16/46* (2013.01)

(58) Field of Classification Search
CPC ........... H01L 21/68785; C23C 16/4588; C23C 16/4581; C23C 16/4583
See application file for complete search history.

(56) References Cited

U.S. PATENT DOCUMENTS

| | | | | |
|---|---|---|---|---|
| 3,993,018 A | * | 11/1976 | Kranik .................... | B05C 11/08 118/503 |
| 4,735,701 A | * | 4/1988 | Allen ....................... | G11B 5/84 118/500 |
| 5,195,729 A | * | 3/1993 | Thomas ............ | H01L 21/67346 269/21 |
| 6,001,183 A | * | 12/1999 | Gurary ................ | C23C 16/4584 118/720 |
| 2004/0011293 A1 | * | 1/2004 | Johnson ............ | H01L 21/68721 118/728 |
| 2004/0187790 A1 | * | 9/2004 | Bader .................. | C23C 16/4581 118/728 |
| 2005/0211167 A1 | * | 9/2005 | Gunji ...................... | C23C 16/44 118/715 |

(Continued)

FOREIGN PATENT DOCUMENTS

| | | |
|---|---|---|
| JP | 2009-253115 | 10/2009 |
| JP | 2010-239102 | 10/2010 |

*Primary Examiner* — Karla Moore
*Assistant Examiner* — Charlee Bennett
(74) *Attorney, Agent, or Firm* — IPUSA, PLLC

(57) ABSTRACT

A substrate processing apparatus includes a vacuum chamber; a turntable rotatably provided in the vacuum chamber, on which a circular substrate is to be mounted, and provided with a circular concave portion at a front surface having a larger diameter than that of the substrate, and a circular substrate mounting portion provided in the concave portion having a diameter smaller than that of the concave portion and the substrate at a position higher than a bottom portion of the concave portion, the center of the substrate mounting portion being off center with respect to the center of the concave portion toward an outer peripheral portion side of the turntable; a process gas supplying unit which supplies a process gas to the substrate; and a vacuum evacuation mechanism which evacuates the vacuum chamber.

10 Claims, 15 Drawing Sheets

(56) References Cited

U.S. PATENT DOCUMENTS

| | | | |
|---|---|---|---|
| 2006/0266289 A1* | 11/2006 | Verghese | C23C 16/4408 118/715 |
| 2009/0127672 A1* | 5/2009 | Kinbara | C23C 16/4588 257/652 |
| 2010/0055318 A1* | 3/2010 | Volf | C23C 16/4584 427/255.28 |
| 2011/0049779 A1* | 3/2011 | Egami | C23C 16/4583 269/289 R |

* cited by examiner

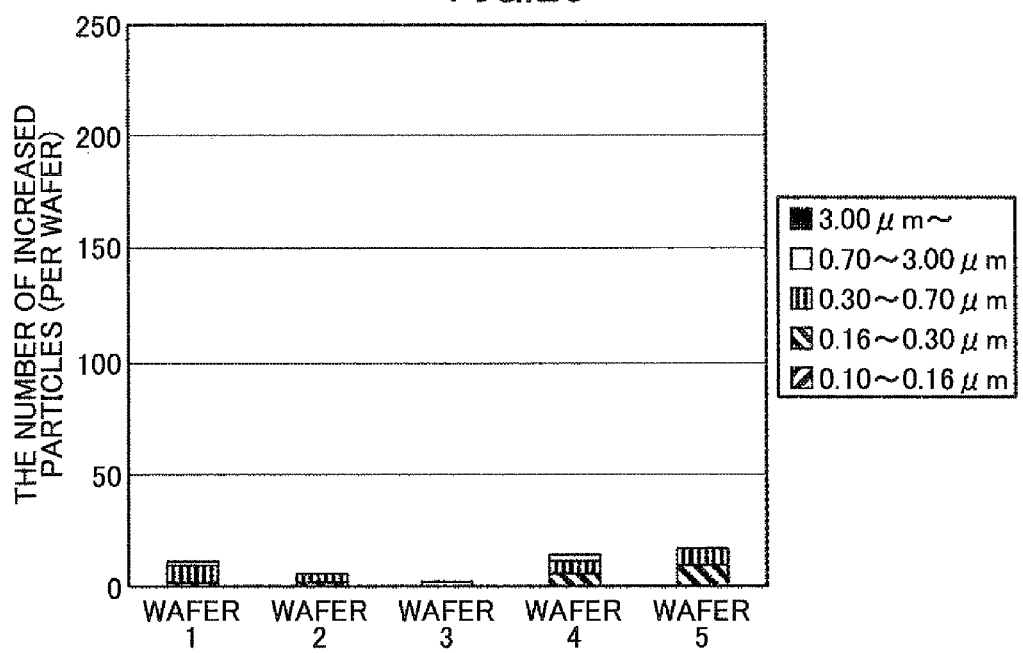
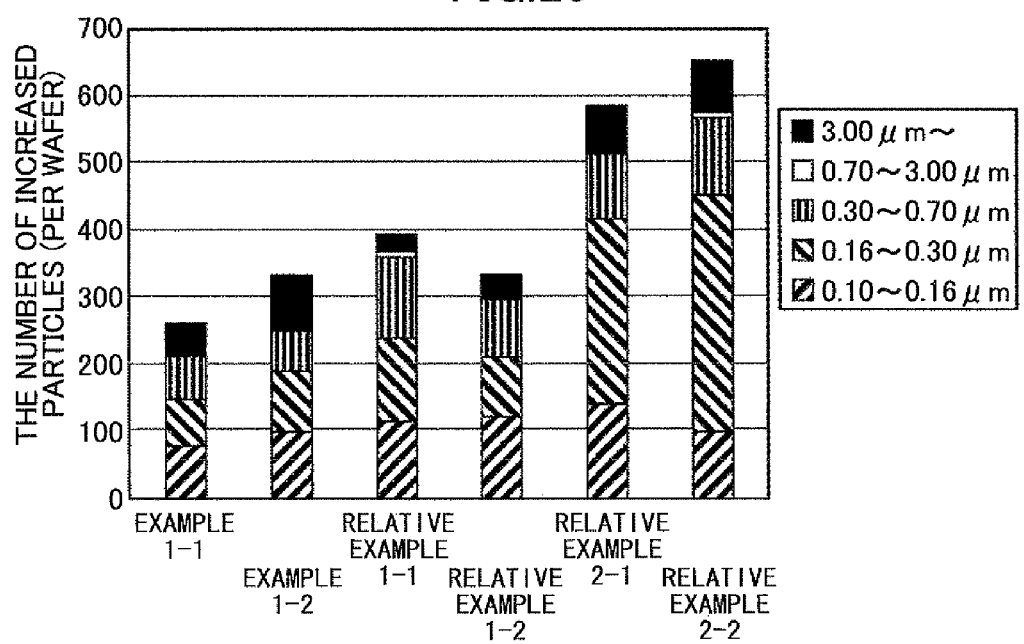

SUBSTRATE PROCESSING APPARATUS

CROSS-REFERENCE TO RELATED APPLICATION

The present application is based on Japanese Priority Application No. 2012-095779 filed on Apr. 19, 2012, the entire contents of which are hereby incorporated herein by reference.

BACKGROUND OF THE INVENTION

Field of the Invention

The present invention relates to a substrate processing apparatus performing a process on a substrate using a process gas.

As a method in which a thin film such as a silicon oxide film ($SiO_2$) is deposited on a substrate such as a semiconductor wafer (hereinafter referred to as a "wafer"), Atomic Layer Deposition (ALD) using an apparatus disclosed in Patent Document 1 is known. In this apparatus, five wafers are aligned on a turntable in a circumferential direction, and plural kinds of reaction gasses capable of reacting with each other are supplied from plural gas nozzles provided above the turntable, respectively, in order onto the wafers being rotated. The turntable is provided with plural concave portions into which the wafers are positioned and mounted, respectively. Each of the concave portions is provided to have a size one size larger than that of the respective wafer so that a clearance is provided at an outer edge of the wafer when the wafer is mounted in the concave portion in a plan view for detachably holding the wafer.

In Patent Document 2, a structure in which a wafer mounting surface of a wafer stage is configured such that an outer peripheral end of the wafer mounting surface is positioned at an inner side than an outer peripheral end of a back surface of a semiconductor wafer which contacts the wafer mounting surface in order to prevent rubbing between the wafer and the wafer stage.

PATENT DOCUMENT

[Patent Document 1] Japanese Laid-open Patent Publication No. 2010-239102
[Patent Document 2] Japanese Laid-open Patent Publication No. 2009-253115

SUMMARY OF THE INVENTION

The present invention is made in light of the above problems, and provides a substrate processing apparatus capable of suppressing lowering of throughput, and retaining uniformity of the in-plane process while suppressing the adhesion of particles to a substrate when performing a process supplying a process gas to the substrate.

According to an embodiment, there is provided a substrate processing apparatus including a vacuum chamber; a turntable rotatably provided in the vacuum chamber, on which a circular substrate is to be mounted, and provided with a circular concave portion at a front surface having a larger diameter than that of the substrate, and a circular substrate mounting portion provided in the concave portion having a diameter smaller than those of the concave portion and the substrate at a position higher than a bottom portion of the concave portion, the center of the substrate mounting portion being off center (decenterized) with respect to the center of the concave portion toward an outer peripheral portion side of the turntable; a process gas supplying unit which supplies a process gas to the substrate; and a vacuum evacuation mechanism which evacuates the vacuum chamber.

Note that also arbitrary combinations of the above-described constituents, and any exchanges of expressions in the present invention, made among methods, devices and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

FIG. 25 is a view showing a characteristic obtained in a relative example; and

FIG. 26 is a view showing a characteristic obtained in the example of the embodiment and the relative example.

DETAILED DESCRIPTION OF THE PREFERRED EMBODIMENTS

Figure 1:
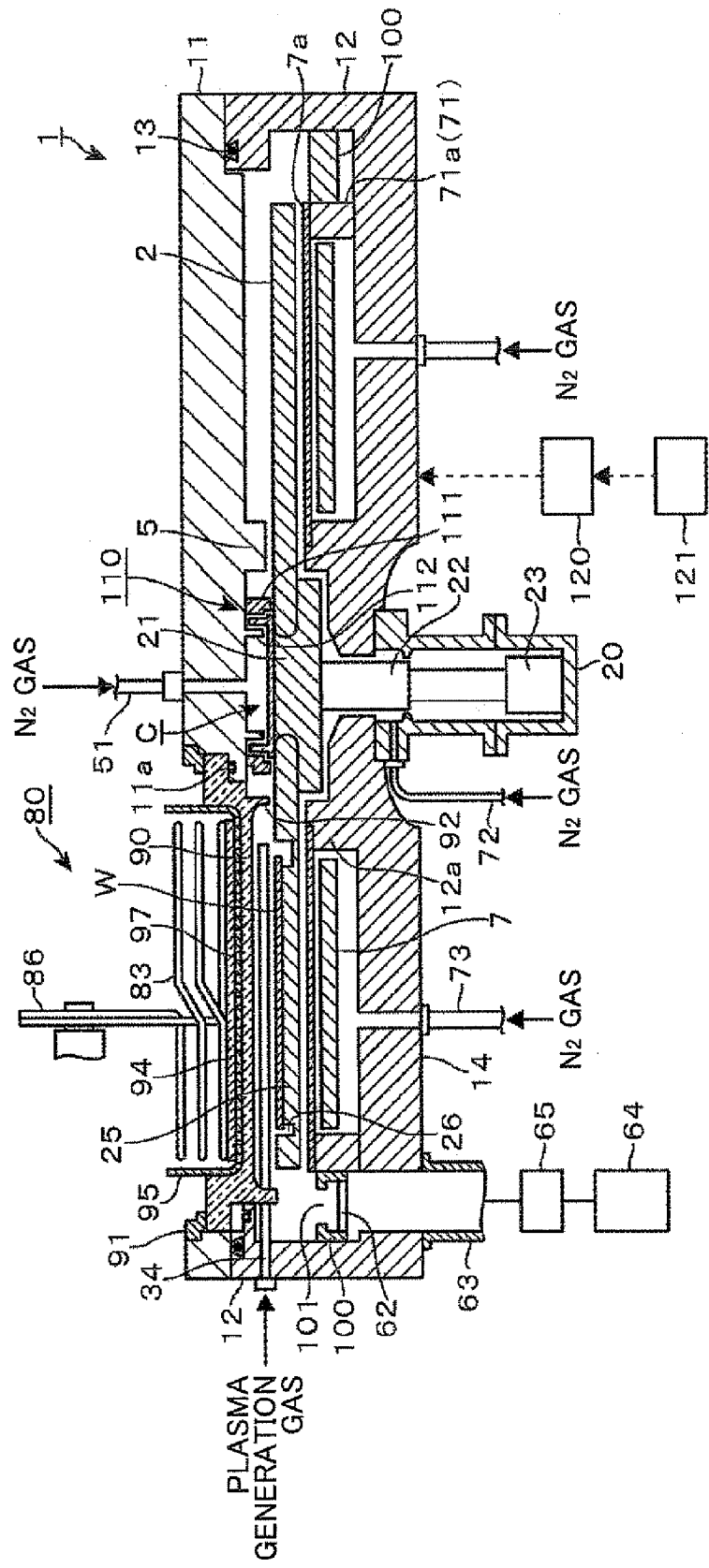
FIG. 1 is a vertical cross-sectional view showing an example of a substrate processing apparatus of an example.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated. Further, drawings are not intended to show relative ratios of a component or components. Thus, specific sizes should be arbitrarily determined based on the non-limiting embodiments explained in the following.

First, a problem of a conventional substrate processing apparatus is explained.

For the above described substrate processing apparatus as disclosed in Patent Document 1, when performing a process to plural, five, for example, wafers in order, a deposition process is performed for the five wafers while maintaining a turntable at a predetermined temperature (film deposition temperature), the treated wafers are taken out, and then five subsequent untreated wafers are mounted on the turntable to be processed. Thus, when the untreated wafers are at a room temperature first, for example, there is an in-plane temperature variation for each of the wafers when mounted on the turntable. Then, the in-plane temperature of each of the wafers becomes constant as being heated toward the film deposition temperature. Further, there is a case when the untreated wafers are previously performed with a heat process other than the deposition process, for example. In such a case, if an apparatus or period is provided for cooling the wafers, it lowers throughput and increases cost. Thus, the case may be, the wafers are naturally cooled in a transferring path to be mounted on the turntable via an atmosphere or peripheral members, for example so that the wafers are mounted on the turntable at a certain temperature. At this time, a portion of the wafer at an outer edge portion side tends to contact atmosphere more than a portion of the wafer at a center portion side. Further, a part of the wafer at a back surface side is supported by a pick (arm), which is at a lower temperature than the wafer. Thus, for the wafers previously performed with the heat treatment, the in-plane temperature variation already occurs for each of the wafers when the wafers are mounted on the turntable, and the variation is decreased to be constant by heating via the turntable.

When the in-plane temperature variation exists for each of the wafers, a wafer may upwardly warp at a center. When a wafer is warped, the wafer contacts the turntable at the outer edge portion such that the center portion is floated from the turntable. Then, the warped wafer generally becomes flat as the temperature of the wafer becomes even by the heating via the turntable. At this time, when the wafer becomes flat, the wafer expands toward the outer edge portion side while the outer edge portion of the wafer is rubbing with the surface of the turntable. Thus, the edge (outer edge portion) of the wafer or the surface of the turntable is ground to generate particles. There is a possibility that these particles pass through the outer edge portion side of the wafer and attach to a front surface of the wafer when the wafer is horizontally extended. Further, when the turntable is rotated while the wafer is being warped upward, the wafer moves toward an outer edge side of the turntable by a centrifugal force of the turntable for an amount equal to a clearance and the particles are therefore generated.

On the other hand, if the wafers at a room temperature or the wafers already performed with the heat treatment are left at a position above the turntable a bit apart from the turntable until the in-plane temperature of each of the wafers becomes constant, in other words, until each of the wafers becomes flat, throughput is lowered for a period necessary for leaving the wafers. Further, even for the flat wafer, when the wafer moves by centrifugal force, the back surface of the wafer and the front surface of the turntable rub with each other to generate particles.

Thus, in this embodiment, as will be explained later in detail, the substrate processing apparatus is configured to be capable of suppressing lowering of throughput, and retaining uniformity of the in-plane process while suppressing the adhesion of particles to a substrate even when a deposition process is performed for a wafer W warped upward at a center.

An example of a substrate processing apparatus of the embodiment is explained with reference to FIG. 1 to FIG. 6. As shown in FIG. 1 to FIG. 4, the substrate processing apparatus includes a substantially circular vacuum chamber 1 in a plan view and a turntable 2 provided in the vacuum chamber 1 such that the rotational center of which is at the center of the vacuum chamber 1. The turntable 2 is made of quartz, for example. The film deposition apparatus is configured to perform a film deposition process on wafers W.

Each part of the substrate processing apparatus is explained.

The vacuum chamber 1 includes a ceiling plate 11 and a chamber body 12 where the ceiling plate 11 is detachably attached to the chamber body 12. A separation gas supplying pipe 51 is connected to a center portion of the ceiling plate 11 at an upper surface side for supplying nitrogen ($N_2$) gas as a separation gas to prevent mixing of different process gasses at a center portion area C in the vacuum chamber 1. Further, a ring-shaped sealing member 13 such as an O-ring or the like is provided at an upper outer peripheral portion of the chamber body 12 in the vacuum chamber 1.

As shown in FIG. 1, a heater unit 7, which is a heater mechanism, is provided at an upper side of a bottom portion 14 in the vacuum chamber 1 so that the wafers W mounted on the turntable 2 are heated to be a film deposition temperature, 300° C. for example, via the turntable 2. The vacuum chamber 1 further includes a cover member 7a which covers a protruded portion 71a provided at a side of the heater unit 7 and the upper side of the heater unit 7. Further, the bottom portion 14 of the vacuum chamber 1 is provided with purge gas supplying pipes 73 aligned in a circumferential direction for purging a space below the heater unit 7.

The turntable 2 is fixed to a cylindrical shaped core unit 21 at its center portion. The turntable 2 is configured to be rotatable around a vertical axis (in this embodiment, a clockwise direction) by a rotary shaft 22 connected to a lower surface of the core unit 21 and extending in a vertical direction. The vacuum chamber 1 is provided with a driving unit (rotational mechanism) 23 which rotates the rotary shaft 22 around the vertical axis and a case body 20 in which the rotary shaft 22 and the driving unit 23 are housed. A flange portion of the case body 20 at an upper surface is attached to the lower surface of the bottom portion 14 of the vacuum chamber 1 in an airtight manner. Further, a purge gas supplying pipe 72 for supplying nitrogen gas as a purge gas to a lower area of the turntable 2 is connected to the case body 20. The bottom portion 14 of the vacuum chamber 1 at an outer peripheral side of the core unit 21 is formed in a ring shape to extend closer to the turntable 2 from a lower side to form a protruded portion 12a.

Figure 2:
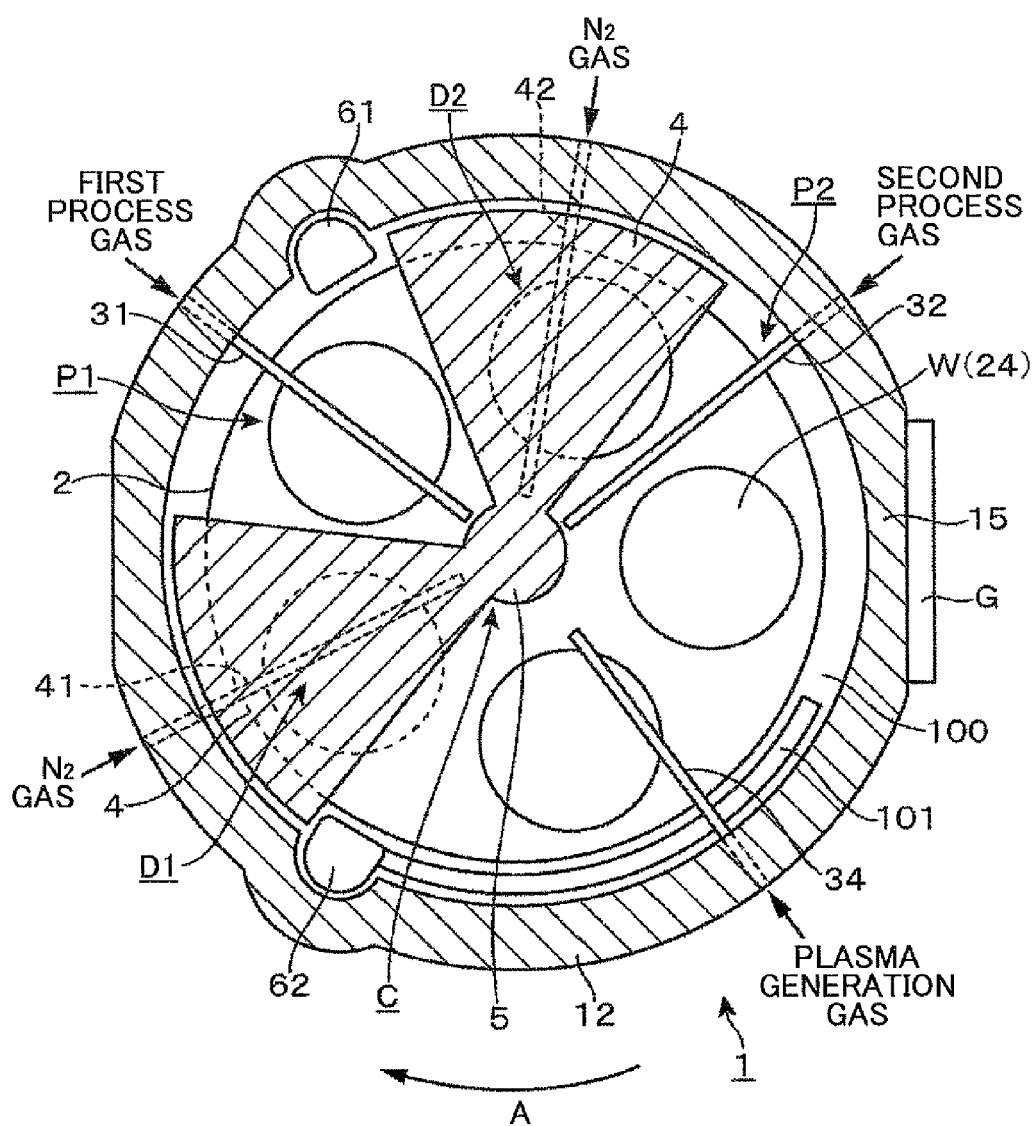
FIG. 2 is a lateral plan view of the substrate processing apparatus shown in FIG. 1.
Figure 3:
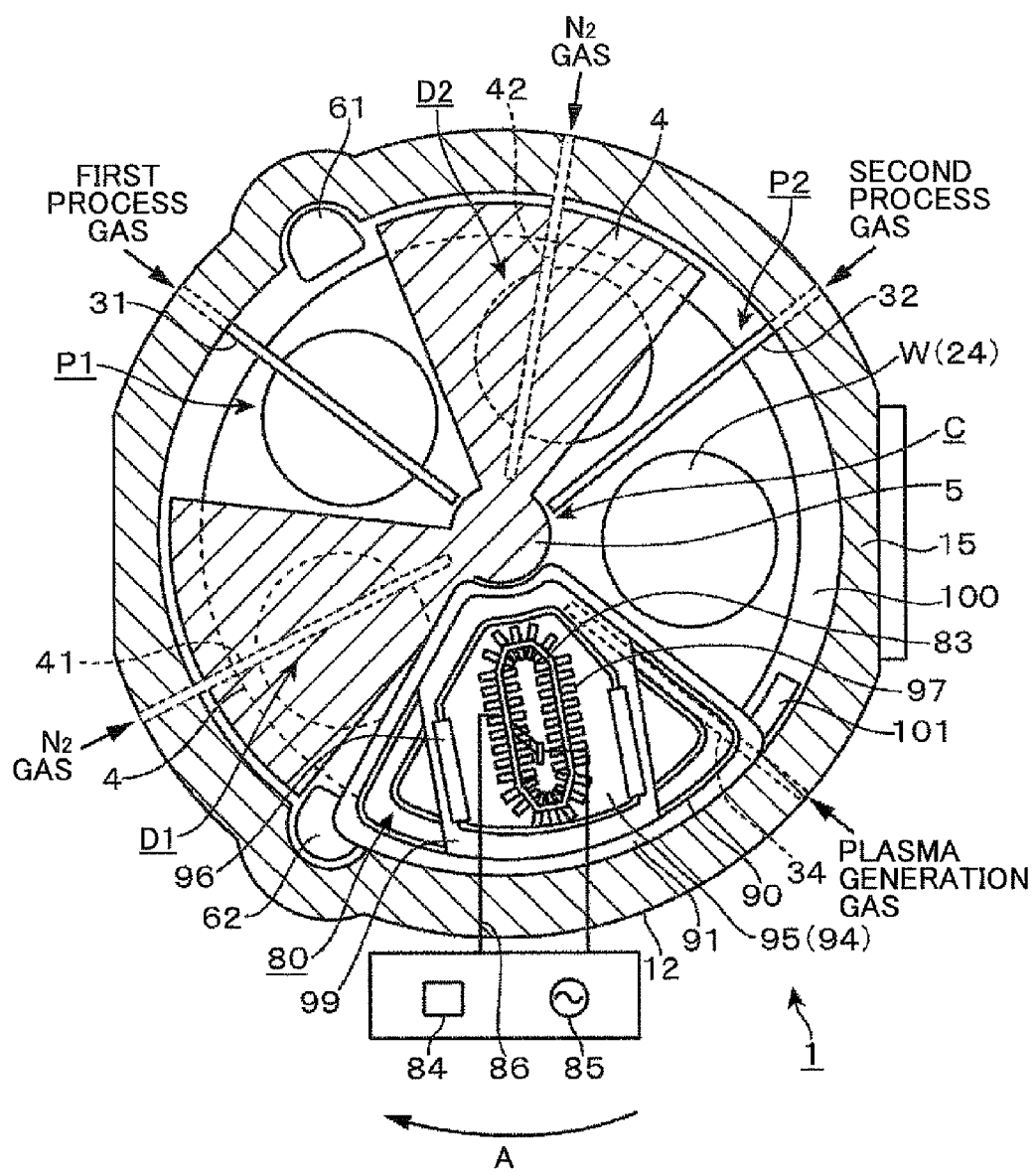
FIG. 3 is a lateral plan view of the substrate processing apparatus shown in FIG. 1.
Figure 4:
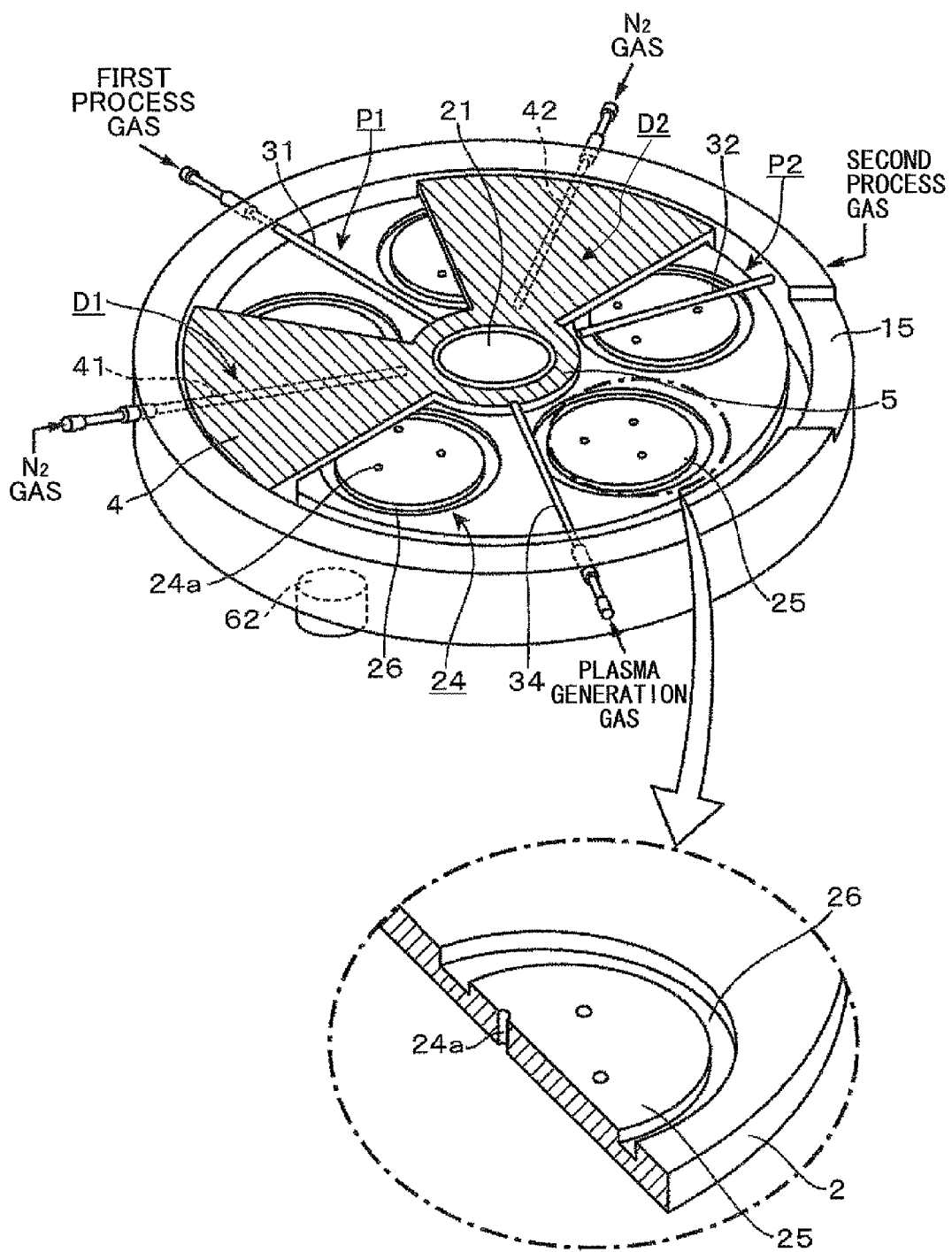
FIG. 4 is a perspective view showing the inside of the substrate processing apparatus shown in FIG. 1.

As shown in FIG. 2 and FIG. 3, circular concave portions 24 are provided at a front surface portion of the turntable 2 for positioning in and holding the circular wafers W made of silicon, respectively, as substrate mounting areas. Plural, five, for example, concave portions 24 are formed along a rotational direction of the turntable 2 (circumferential direction). Each of the concave portions 24 is formed to have a larger diameter than that of the wafer W when seen in a plan view in order to provide a clearance between the outer edge of the wafer W. As shown in FIG. 4, each of the concave portions 24 is provided with, at its bottom portion, three through holes 24a through which three lift pins (not shown in the drawings), for example, for supporting the respective wafer W from a lower side and lifting the wafer W penetrate. Here, in FIG. 2 and FIG. 3, the diameter of the concave portion 24 is simplified and schematically shown, and the through holes 24a are omitted in the drawings other than FIG. 4.

Figure 5:
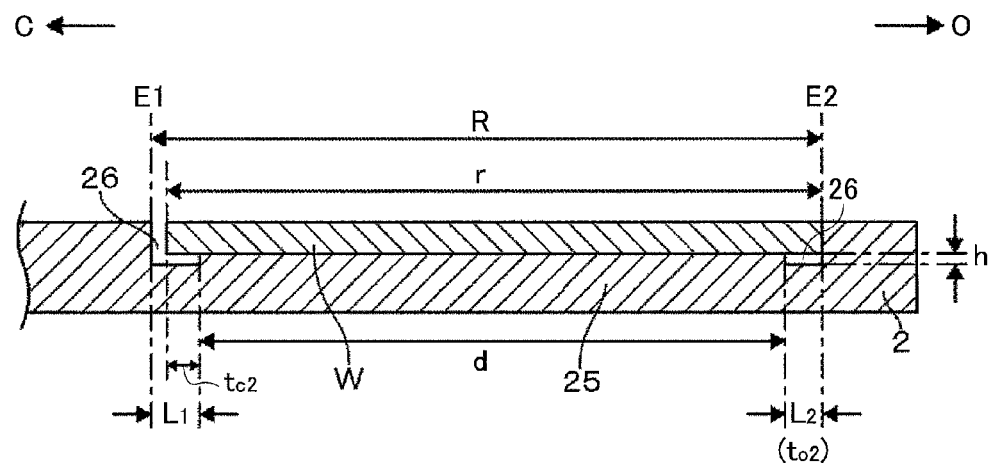
FIG. 5 is a vertical cross-sectional view showing a part of the inside of the substrate processing apparatus shown in FIG. 1.
Figure 6:
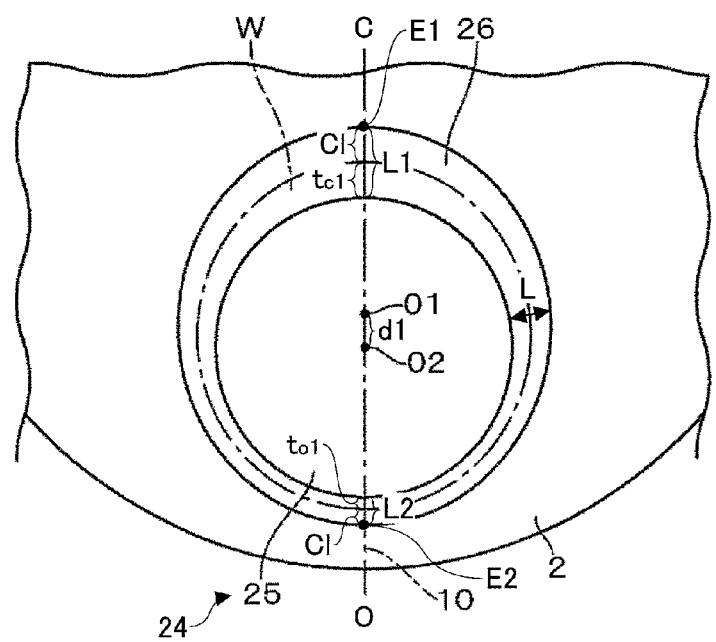
FIG. 6 is a plan view showing a part of a turntable of the substrate processing apparatus shown in FIG. 1.

In this embodiment, as shown in FIG. 4 to FIG. 6, a mounting table 25 (substrate mounting portion) is provided as a protruding portion at a bottom surface of each of the concave portions 24 for supporting a center portion of the respective wafer W from a lower side. Each of the mounting tables 25 is configured to have a flat circular shape and the upper surface of which is a flat surface. The mounting table 25 is formed to have a circular shape with a size a bit smaller than the wafer W when seen in a plan view in order to have the peripheral edge portion of the wafer W floated from the bottom surface of the concave portion 24 along the circumferential direction. In other words, the mounting table 25 is configured such that the peripheral edge portion of the wafer W does not touch the mounting table (protruded from the mounting table 25). Thus, a ring-shaped groove 26 is provided between an inner wall surface of the concave portion 24 and an outer wall surface of the mounting table 25. Therefore, the mounting table 25 is formed such that the back surface of the outer edge of the wafer W (peripheral edge portion) faces the bottom surface (groove 26) of the concave portion 24 along the circumferential direction when the wafer W is mounted on the mounting table 25.

As shown in FIG. 6, in this embodiment, the mounting table 25 is provided to be off center (decenterized, or eccentric) with respect to the concave portion 24 toward an outer peripheral portion side O of the turntable 2 when seen in a plan view. Specifically, when it is assumed that the center position of the concave portion 24 is "O1" and the center position of the mounting table 25 is "O2" when seen in a plan view, the center position O2 of the mounting table 25 is shifted with respect to the center position O1 of the concave portion 24 toward the outer peripheral portion side O of the turntable 2 for a distance d1. Thus, as shown in FIG. 6, in this example, the center positions O1 and O2 are apart from each other and aligned on a line 10 which extends in a radius direction of the turntable 2.

The width on the line 10 when viewing the groove 26 of the concave portion 24 in a plan view (the size between the inner wall surface of the concave portion 24 and the outer wall surface of the mounting table 25) is formed such that a width L1 at a center portion side C is larger than a width L2 at the outer peripheral portion side O of the turntable 2. Specifically, a width L of the groove 26 along the rotational direction of the turntable 2 becomes a size between the width L1 and the width L2 and decreases from the center portion side C to the outer peripheral portion side O. As such, the width L becomes a length between L2 to L1 along the circumferential direction.

FIG. 5 corresponds to a cross-sectional view of FIG. 6. FIG. 5 shows a state in which the outer edge of the wafer W contacts the inner peripheral surface of the concave portion 24 at a point E2 by centrifugal force of the turntable 2.

Here, the diameter of the turntable 2 is about 1000 mm, and the diameter "r" of the wafer W is about 300 mm, for example. In such a structure, the diameter "R" of the concave portion 24 may be 302 mm, for example.

As an example, the width L1 and the width L2 may be 3 mm and 2 mm, respectively. At this time, the diameter "d" of the mounting table 25 becomes 302−(3+2)=297 mm. Further, at this time, the distance d1 between the center position O2 of the mounting table 25 and the center position O1 of the concave portion 24 shown in FIG. 6 becomes 0.5 mm.

With this structure, provided that a clearance C1 between the periphery of the wafer W and the inner wall of the concave portion 24 is 1 mm along the entirety of the periphery of the wafer W, for example, when the wafer W is mounted on the mounting table 25 within the concave portion 24 while the turntable 2 is not being rotated, a length (ejected amount) "t" that the outer edge of the wafer W is protruded from an upper edge of the mounting table 25 becomes as follows. The ejected amount $t_{c1}$ at the center portion side C becomes $t_{c1}$=about 2 mm and the ejected amount $t_{O1}$ at the outer peripheral portion side O becomes $t_{O1}$=about 1 mm.

On the other hand, when the outer edge of the wafer W contacts the inner peripheral surface of the concave portion 24 by centrifugal force of the turntable 2 at the point E2, the length (ejected amount) "t" that the outer edge of the wafer W is protruded from the upper edge of the mounting table 25 becomes as follows. The ejected amount $t_{c2}$ at the center portion side C becomes $t_{c2}$=about 1 mm and the ejected amount $t_{O2}$ at the outer peripheral portion side O becomes $t_{O2}$=about 2 mm. In this embodiment, by off centering the mounting table 25 with respect to the concave portion 24, the ejected amount can be within a range between 1 mm to 2 mm when the turntable 2 is being rotated. This structure is explained in detail. Here, for example in FIG. 6, the width "L" is depicted to be larger in an exaggerated manner. The height "h" of the mounting table 25 may be about 0.03 mm to 0.2 mm, and may be 0.03 mm in this example. The height "h" of the mounting table 25 is set such that the surfaces of the wafer W and the turntable 2 become substantially the same height when the wafer W is mounted on the mounting table 25. In other words, the mounting table 25 is configured such that the lower surface of the wafer W is positioned at a lower height than the surface of the turntable 2 when the wafer W is mounted on the mounting table 25.

Figure 7:
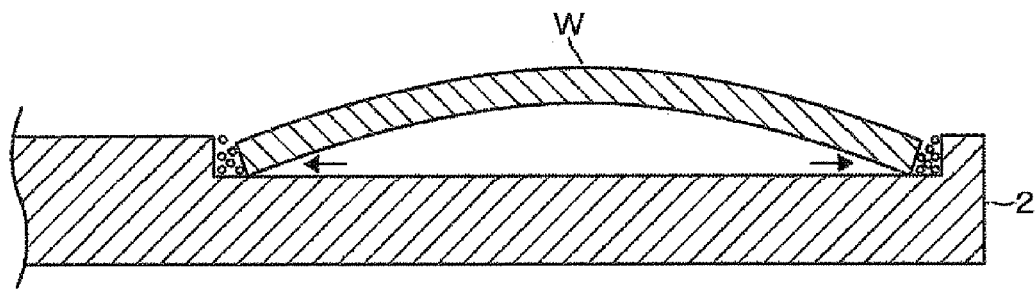
FIG. 7 is a vertical cross-sectional view showing a problem of a turntable.
Figure 8:
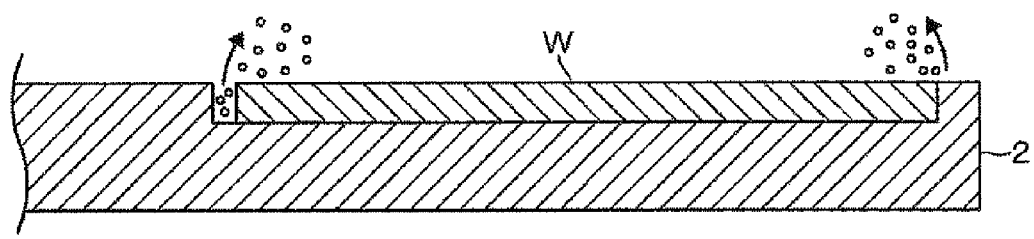
FIG. 8 is a vertical cross-sectional view showing a problem of a turntable.

First, a case in which the mounting table 25 is not provided and the wafer W is directly mounted on the bottom surface of the concave portion 24 is explained with reference to FIG. 7 to FIG. 9. As explained above, when the untreated wafer W before mounting the turntable 2 is at a room temperature, there is an in-plane temperature variation in for the wafer W when the wafer W is mounted on the turntable 2. Thereafter, the temperature variation becomes small when the wafer W is heated to the film deposition temperature. On the other hand, when the wafer W is previously processed with another heat treatment in another heat treatment apparatus other than the substrate processing apparatus, the wafer W is naturally cooled while being transferred to the substrate processing apparatus. At this time as well, the in-plane cooling speed becomes uneven for the wafer W. Thus, when the wafer W is previously performed with the heat treatment, there is a temperature variation in the wafer W when the wafer W is mounted on the turntable 2, and thereafter, the temperature variation becomes small by the heat via the turntable 2.

Thus, for the untreated wafer W, even when it is at a room temperature or previously performed with the heat treatment, there is an in-plane temperature variation when the wafer W is mounted on the turntable 2. At this time, the wafer W may warp upward based on the temperature variation of the wafer W. When the wafer W is warped upward, the wafer W is apart from the surface of the turntable 2 at the center portion and meanwhile the wafer W contacts the turntable 2 at the outer edge. Then, as shown in FIG. 7, when the wafer W warped upward is directly mounted on the bottom surface of the concave portion 24, the outer edge of the wafer W and the surface of the turntable 2 (specifically, the bottom surface of the concave portion) rub with each other when the wafer W is horizontally extended to generate particles as the temperature of the wafer W becomes even. As shown in FIG. 8, after the wafer W is completely horizontally extended, the particles pass through the outer edge side of the wafer W and attach to the front surface of the wafer W. Thus, it is not preferable to directly mount the wafer W on the bottom surface of the concave portion 24 in order to reduce as small as possible the number of particles attached to the surface of the wafer W.

Figure 9:
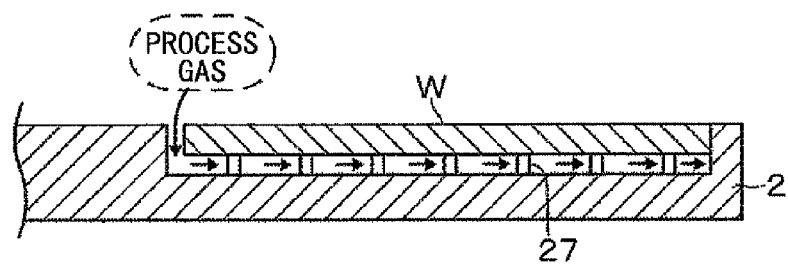
FIG. 9 is a vertical cross-sectional view showing a problem of a turntable.

Meanwhile, as shown in FIG. 9, in a case in which plural pin-type protruding portions 27 each having a height about 30 μm or 150 μm, for example, are provided at the bottom surface of the concave portion 24 and the wafer W is supported via the protruding portions 27 like in a floated manner, the outer edge of the wafer W is apart from the bottom surface of the concave portion 24 at an upper direction. Thus, even when the wafer W is upwardly warped at the center, the generation of the particles as described above can be suppressed so that the adhesion of the particles to the front surface of the wafer W can be reduced. However, when the wafer W is supported in the floated manner, as will be explained later in the example, the in-plane process (the thickness of the thin film, for example) becomes uneven. In other words, a part of the process gas supplied to the outer peripheral portion of the wafer W, for example, passes to the back surface side of the wafer W, the amount of the process gas supplied to the outer peripheral portion becomes smaller than that to the center portion and the in-plane process variation may occur. Further, the heating temperature of the wafer W is different at portions contacting the protruding portions 27 and portions being floated from the bottom surface of the concave portion 24 between two adjacent protruding portions 27 having a space therebetween and thus there is an in-plane process variation for the wafer W. Further, when the process gas is a film deposition gas (adsorption gas), the particles caused by the process gas which has passed to the back surface side of the wafer W adhere to the back surface side. Thus, when the wafer W is supported in the floated manner, although the adhesion of the particles to the front surface side of the wafer W can be suppressed, the uniformity of the process cannot be improved and the adhesion of the particles to the back surface cannot be reduced.

On the other, in this embodiment, by providing the above described mounting table 25 at the bottom surface of the concave portion 24, the outer edge of the wafer W does not contact the bottom surface of the concave portion 24, and further the passing of the process gas to the back surface side of the wafer W can be suppressed. Thus, the process uniformity can be improved and the adhesion of the particles to the back surface side of the wafer W can be reduced as well as the adhesion of the particles to the front surface side of the wafer W can be reduced. It means that when the wafer W is supported by the mounting table 25, both merits for the case when the wafer W is directly mounted on the bottom surface of the concave portion 24 (FIG. 7 or FIG. 8) and for the case when the wafer W is supported in the floated manner from the bottom surface of the concave portion 24 (FIG. 9) can be obtained.

However, the concave portion 24 is formed to be one size larger than the wafer W, and further, the wafer W is rotated by the turntable 2 while being processed. Thus, the wafer W being processed moves toward the outer peripheral portion side of the turntable 2 within the concave portion 24 for a clearance between the outer edge of the wafer W and the inner edge of the concave portion 24 by centrifugal force of the turntable 2. Thus, the particles at the front surface side of the wafer W or the uniformity in the process cannot be improved just by providing a mounting table 25 at the center of the concave portion 24, in other words, by the technique disclosed in Patent Document 2.

A case in which the mounting table 25 is provided at a center of the concave portion 24 is explained in the following.

Figure 10:
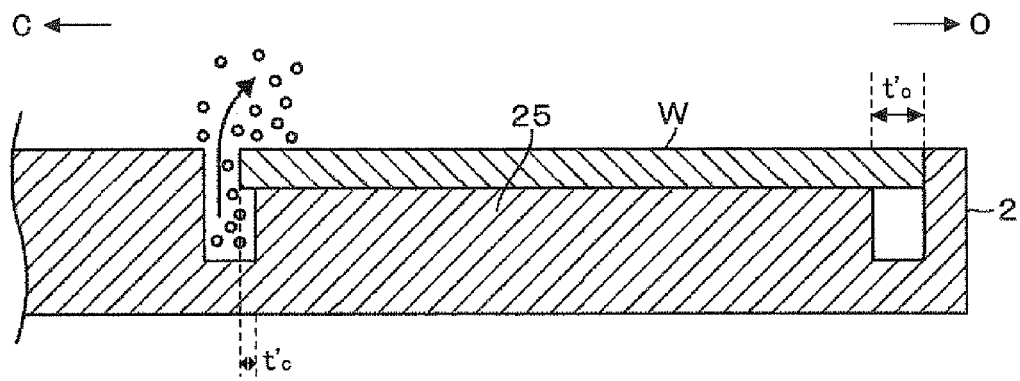
FIG. 10 is a vertical cross-sectional view showing a problem of a turntable.

For example, when the mounting table 25 is provided at the center of the concave portion 24 (when both the widths L1 and L2 explained with reference to FIG. 5 and FIG. 6 are set to be 2.5 mm), when the wafer W moves toward the outer peripheral portion side O of the turntable 2 within the concave portion 24 by centrifugal force of the turntable 2, as shown in FIG. 10, the ejected amount $t'_c$ at the center portion side C of the outer edge of the wafer W from the upper edge of the mounting table 25 is about 0.5 mm and becomes smaller than that ($t'_O$=2.5 mm) at the outer peripheral portion side O of the turntable 2, for example. Thus, when particles are generated at the back surface side of the wafer W at the center portion side C of the turntable 2, these particles may adhere to the front surface side of the wafer W after passing through the outer edge side of the wafer W.

Figure 11:
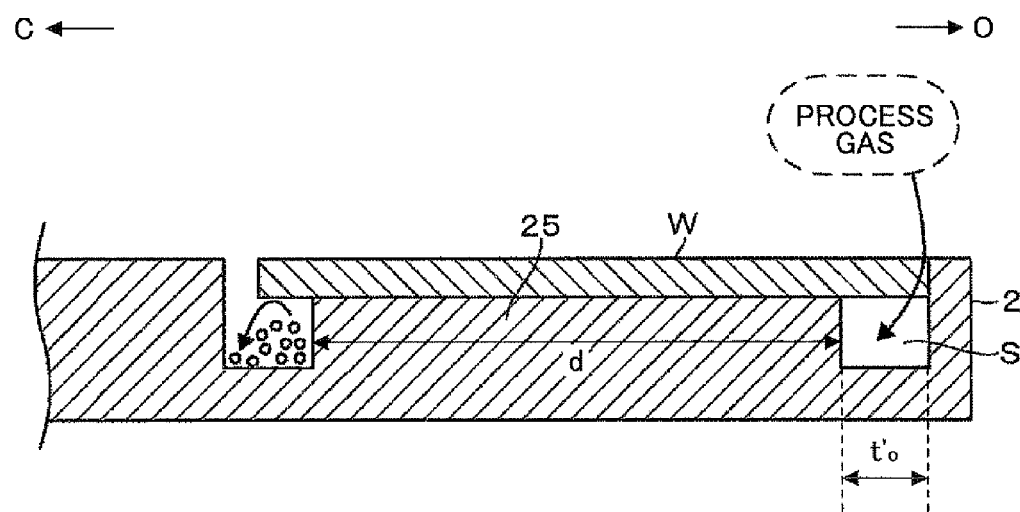
FIG. 11 is a vertical cross-sectional view showing a problem of a turntable.
Figure 12:
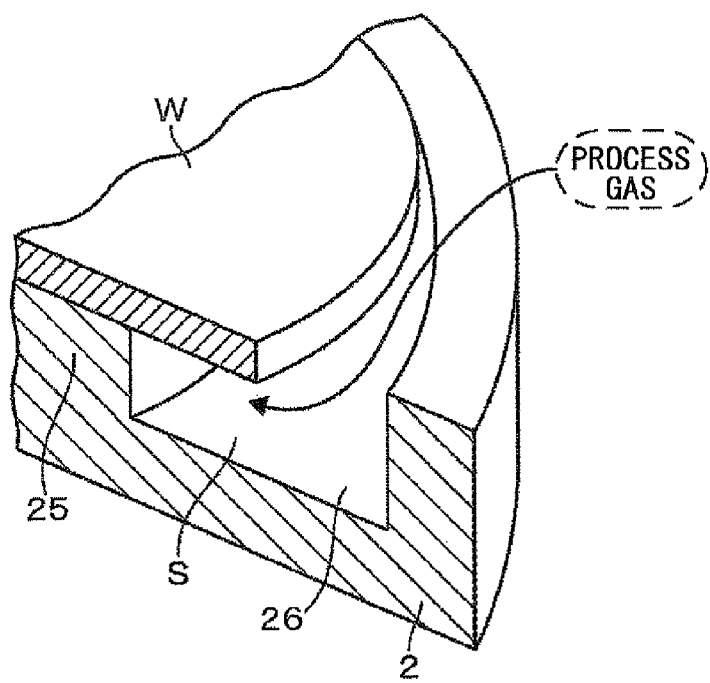
FIG. 12 is a vertical cross-sectional view showing a problem of a turntable.

On the other hand, FIG. 11 shows a case in which the diameter "d" of the mounting table 25 is shortened so that the sufficient ejected amount $t'_c$ as large as about 1 mm can be retained at the center portion side C of the turntable 2 even when the wafer W is shifted toward the outer peripheral portion side O of the turntable 2 by centrifugal force of the turntable 2. At this time, passing of the particles to the front surface side of the wafer W can be suppressed at the center portion side C. Specifically, when the diameter "d" is set for example 296 mm and the widths L1 and L2 are set as 3.0 mm, respectively, the ejected amounts $t'_c$ and $t'_O$ at the center portion side C and the outer peripheral portion side O become 1 mm and 3 mm, respectively, when the wafer W is moved toward the outer peripheral portion side O of the turntable 2 by centrifugal force of the turntable 2 within the concave portion 24. At this time, the ejected amount $t'_O$ at the outer peripheral portion side O of the turntable 2 becomes too large so that a large space S is formed below the outer edge of the wafer W. Thus, the process gas moves to the space S as shown in FIG. 12. Therefore, the in-plane process of the wafer W becomes uneven and the particles tend to adhere to the back surface side at the outer edge. In other words, when such a large space S is formed at the back surface side of the wafer W, deterioration of characteristic as shown in FIG. 9 in which the wafer W is supported by the protruding portions 27, occurs at the back surface side.

Thus, according to the present embodiment, as explained above with reference to FIG. 5 and FIG. 6, the mounting table 25 is formed at a position off center with respect to the concave portion 24 toward the outer peripheral portion side O of the turntable 2. An example of a method of forming the mounting table 25 is explained.

For example, as shown in FIG. 5, when setting the ejected amount $t_{O2}$ at the outer edge of the wafer W at the outer peripheral portion side O to be a size within a predetermined range at a state in which the outer edge of the wafer W contacts the inner peripheral surface of the concave portion 24 at the point E2 by centrifugal force of the turntable 2, the outer peripheral edge of the mounting table 25 at the outer peripheral portion side O is formed to be positioned inside (toward the center portion side C of the turntable 2) for the ejected amount $t_{O2}$ from the inner edge of the concave portion 24. In other words, the width L2 shown in FIG. 5 is set to be $L2=t_{O2}$. Further, at the center portion side C, the outer peripheral edge of the mounting table 25 at the center portion side C is formed to be positioned outside (toward the outer peripheral portion side O) for the ejected amount $t_{c2}$ and a difference (2Cl) between the diameter "R" of the concave portion 24 and the diameter "r" of the wafer W from the inner edge of the concave portion 24. In other words, the width L1 shown in FIG. 5 is set to be $L1=t_{c2}+2Cl$. The mounting table 25 may be formed to have a circular shape. With this structure, as shown in FIG. 6, the center position O2 of the mounting table 25 and the center position O1 of the concave portion 24 are provided to be aligned in the radius direction of the turntable 2 to be apart from each other. It means that the mounting table 25 is formed such that the center position O2 of which is at a position off center (shifted position) with respect to the center position O1 of the concave portion 24 in the radius direction of the turntable 2 toward the outer peripheral portion side.

In this example, when the outer edge of the wafer W contacts the inner peripheral surface of the concave portion 24 at the point E2 by centrifugal force of the turntable 2, as shown in FIG. 5, the ejected amounts $t_{c2}$ and $t_{O2}$ at the center portion side C and the outer peripheral portion side O of the turntable 2 is set to be 1 mm and 2 mm, respectively. Thus, the diameter "d" of the mounting table 25 is 297 mm (=302 mm (the diameter "R" of the concave portion 24)−1 mm (the ejected amount $t_{c2}$ at the center portion side C)−2 mm (the ejected amount $t_{O2}$ at the outer peripheral portion side O)−2 mm (2Cl)). Further, the width L1 at the center portion side C becomes a size (=3 mm) obtained by adding 2Cl to the ejected amount $t_{c2}$, and the width L2 at the outer peripheral portion side O becomes a size equal to the ejected amount $t_{O2}$ (=2 mm). Further, as described above, the ejected amounts $t_{c1}$ and $t_{O1}$ at the center portion side C and the outer peripheral portion side O of the turntable 2 are 2 mm and 1 mm, respectively, when the clearance between the periphery of the wafer W and the inner wall of the concave portion 24 becomes equal along the entirety of the periphery of the wafer W while the turntable 2 is not being rotated in this example. Thus, in this example, the mounting table 25 is configured such that the ejected amount $t_{c1}$ and the ejected amount $t_{O2}$ become equal. Here, the ejected amount $t_{c1}$ is the peripheral edge portion of the wafer W protruded from the mounting table 25 at the center portion side C of the turntable 2 when the wafer W is mounted on the mounting table 25 such that the clearances C1 between the concave portion 24 and the wafer W at the center portion side C and the outer peripheral portion side O become equal before the turntable 2 is rotated. The ejected amount $t_{O2}$ is the peripheral edge portion of the wafer W protruded from the mounting table 25 at the outer peripheral portion side O of the turntable 2 when the wafer W contacts the inner wall surface of the concave portion 24 by centrifugal force in accordance with the rotation of the turntable 2.

Subsequently, referring back to the explanation of each of the parts of the substrate processing apparatus, as shown in FIG. 2 and FIG. 3, five nozzles 31, 32, 34, 41 and 42, made of quartz, for example, are radially placed in the circumferential direction (the rotational direction) of the turntable 2 with spaces between each other at positions facing areas where the concave portions 24 of the turntable 2 pass in the vacuum chamber 1, respectively. Each of the nozzles 31, 32, 34, 41 and 42 is attached to extend from the outer peripheral wall of the vacuum chamber 1 toward the center portion area C in parallel while facing the wafers W, for example. In this example, the plasma generation gas nozzle 34, the separation gas nozzle 41, the first process gas nozzle 31, the separation gas nozzle 42 and the second process gas nozzle 32 are aligned in this order from a transfer port 15, as will be explained later, in a clockwise direction (the rotational direction of the turntable 2). As shown in FIG. 1, a plasma generation unit 80, which will be explained later, is provided above the plasma generation gas nozzle 34 for plasma activating the gas discharged from the plasma generation gas nozzle 34.

The process gas nozzles 31 and 32 function as a first process gas supplying unit and a second process gas supplying unit, respectively, and the separation gas nozzles 41 and 42 function as separation gas supplying units, respectively. In FIG. 2 and FIG. 4, the plasma generation unit 80 and a housing 90, which will be explained later, are not shown for explanation purpose so that the plasma generation gas nozzle 34 can be shown, while in FIG. 3, the plasma generation unit 80 and the housing 90 are shown.

Each of the nozzles 31, 32, 34, 41 and 42 is connected to a gas supply source (not shown in the drawings) via a flow regulation valve as explained in the following. The first process gas nozzle 31 is connected to a supply source of a first process gas containing silicon (Si) such as Bis Tertiary-Butylamino Silane (BTBAS: $SiH_2(NHC(CH_3)_3)_2$)) gas or the like. The second process gas nozzle 32 is connected to a supply source of a second process gas such as a mix gas of ozone ($O_3$) gas and oxygen ($O_2$) gas (specifically, an oxygen gas supply source provided with an ozonizer), for example. The plasma generation gas nozzle 34 is connected to a supply source of a plasma generation gas such as a mix gas of argon (Ar) gas and oxygen gas, for example. The separation gas nozzles 41 and 42 are connected to a gas supply source of nitrogen ($N_2$) gas, which is the separation gas, respectively. Each of the gas nozzles 31, 32, 34, 41 and 42 is provided with plural gas discharge holes 33 at plural positions along the radius direction of the turntable 2 with a predetermined interval at a lower surface side, for example.

Areas below the process gas nozzles 31 and 32 become a first process area P1 for adsorbing the first process gas onto the wafer W and a second process area P2 for reacting the second process gas with the first process gas adsorbed on the wafer W, respectively. The separation gas nozzles 41 and 42 form separation areas D1 and D2 which separate the first process area P1 and the second process area P2, respectively. As shown in FIG. 2 and FIG. 3, the ceiling plate 11 of the vacuum chamber 1 is provided with protruding portions 4 each having substantially a sector top view shape at the separation areas D1 and D2, respectively. The separation gas nozzles 41 and 42 are housed in the protruding portions 4, respectively. Thus, lower ceiling surfaces which are lower surfaces of the protruding portions 4, respectively, are provided at both sides of the separation gas nozzles 41 and 42 in the circumferential direction, respectively, for preventing mixing of the process gasses. Further, higher ceiling surfaces are provided at both sides of the lower ceiling surfaces in the circumferential direction. The outer peripheral edge portion of the protruding portion 4 (the outer peripheral edge portion of the vacuum chamber 1) faces the outer edge surface of the turntable 2 as well as being bent in an L-shape with a small space between the chamber body 12 in order to prevent mixing of the process gases.

The plasma generation unit 80 is explained. The plasma generation unit 80 includes an antenna 83 made of a metal wire wound in a coil shape. The plasma generation unit 80 is provided to overlap a passing area of the wafers W from the center portion side to the outer peripheral portion side of the turntable 2. Further, the antenna 83 is connected to a high frequency power source 85 whose frequency is 13.56 MHz and output power is 5000 W, for example, via a matching box 84. Further, the antenna 83 is provided to be separated from an inner area of the vacuum chamber 1. It means that the ceiling plate 11 above the plasma generation gas nozzle 34 is provided with an opening having substantially a sector top view shape and is closed by the housing 90 made of quartz or the like, for example, in an airtight manner. The peripheral edge portion of the housing 90 is horizontally protruded like a flange along the circumferential direction and the center portion of the housing 90 is formed to concave toward inner area of the vacuum chamber 1. The antenna 83 is housed in the housing 90. In FIG. 1, a sealing member 11a is provided between the housing 90 and the ceiling plate 11 and a pushing member 91 for pushing the peripheral edge portion of the housing 90 downward is also provided. Further, in FIG. 1, a connection electrode 86 for connecting the plasma generation unit 80, the matching box 84 and the high frequency power source 85 is provided.

As shown in FIG. 1, the housing 90 is provided with a protruding portion 92 for gas regulation which protrudes downward toward the turntable 2 along the circumferential direction at the lower surface in order to prevent intrusion of $N_2$ gas or $O_3$ gas to the lower area of the housing 90. The plasma generation gas nozzle 34 is housed within an area surrounded by the inner peripheral surface of the protruding portion 92, the lower surface of the housing 90 and the upper surface of the turntable 2.

As shown in FIG. 1 and FIG. 3, a Faraday shield 95 having substantially a box shape whose upper surface side is opened is provided between the housing 90 and the antenna 83. The Faraday shield 95 is made of a conductive metal plate and is grounded. The bottom surface of the Faraday shield 95 below the antenna 83 is provided with slits 97 along the circumferential direction for preventing the electric field component, among the electric field and the magnetic field (electromagnetic field) generated by the antenna 83, to reach the wafer W at the lower side while allowing the magnetic field component to reach the wafer W. Each of the slits 97 is formed to extend in a direction perpendicular to a wound direction of the antenna 83. An insulating plate 94 made of quartz, for example, is provided between the Faraday shield 95 and the antenna 83 for insulating the Faraday shield 95 and the antenna 83.

A ring shaped side ring 100 is provided at a position slightly lower than the turntable 2 at the outer peripheral side of the turntable 2 and an upper surface of the side ring 100 is provided with two evacuation ports 61 and 62 apart from each other in the circumferential direction. In other words, the bottom portion 14 of the vacuum chamber 1 is provided with two evacuation ports and the evacuation ports 61 and 62 are provided at positions of the side ring 100 corresponding to the evacuation ports, respectively. Here, the evacuation ports 61 and 62 are referred to as a first evacuation port 61 and a second evacuation port 62, respectively. The first evacuation port 61 is provided at a position between the first process gas nozzle 31 and the separation area D2, which is downstream of the first process gas nozzle 31 in the rotational direction of the turntable 2, and closer to the separation area D2. The second evacuation port 62 is provided at a position between the plasma generation gas nozzle 34 and the separation area D1, which is downstream of the plasma generation gas nozzle 34 in the rotational direction of the turntable 2, and closer to the separation area D1.

The first evacuation port 61 is provided for evacuating the first process gas and the separation gas, while the second evacuation port 62 is provided for evacuating the plasma generation gas in addition to the second process gas and the separation gas. Further, a gas flow pass 101 formed in a groove shape is provided at the upper surface of the side ring 100 at the outer edge side of the housing 90 for passing the gas to the second evacuation port 62 without intervening with the housing 90. As shown in FIG. 1, each of the first evacuation port 61 and the second evacuation port 62 is connected to a vacuum pump 64, which is a vacuum evacuation mechanism, via an evacuation pipe 63 provided with a pressure regulator 65 such as a butterfly valve or the like.

As shown in FIG. 2, the lower surface of the ceiling plate 11 is provided with a protruded portion 5 at the center portion. The protruded portion 5 is formed in substantially a ring shape along the circumferential direction to be continued from a portion of the protruding portion 4 at the center portion area C side. Further the lower surface of the protruded portion 5 is formed to have a height substantially the same as the lower surface of the protruding portion 4. Further, a labyrinth structure portion 110 is provided at a center side further than the protruded portion 5 of the turntable 2 at the upper side of the core unit 21, for preventing mixture of the first process gas and the second process gas at the center portion area C. The labyrinth structure portion 110 has a structure in which a first wall portion 111 which vertically extends along the circumferential direction from the turntable 2 side to the ceiling plate 11 side and a second wall portion 112 which vertically extends along the circumferential direction from the ceiling plate 11 side to the turntable 2 are alternately provided in the radius direction of the turntable 2.

As shown in FIG. 2 and FIG. 3, the transfer port 15 is provided at the sidewall of the vacuum chamber 1 for passing the wafer W between an external transfer arm, not shown in the drawings, and the turntable 2. The transfer port 15 is configured to be capable of being opened and closed by a gate valve G in an airtight manner. Further, as described above, the lift pins, not shown in the drawings, for holding the back surface of the wafer W via the through holes 24a of the turntable 2 are provided at a lower side of the turntable 2 at a position facing the transfer port 15.

The substrate processing apparatus includes a control unit 120 composed of a computer which controls the entire operation of the substrate processing apparatus. The control unit 120 includes a memory storing a program for performing a film deposition process and a surface treatment process, which will be explained later. The program is formed to include steps capable of executing the operation of the substrate processing apparatus and is installed from a storing unit 121 which is a recording medium such as a hard disk, a compact disk (CD), a magneto-optic disk, a memory card, a flexible disk, or the like.

The operation of the embodiment is explained.

Figure 13:
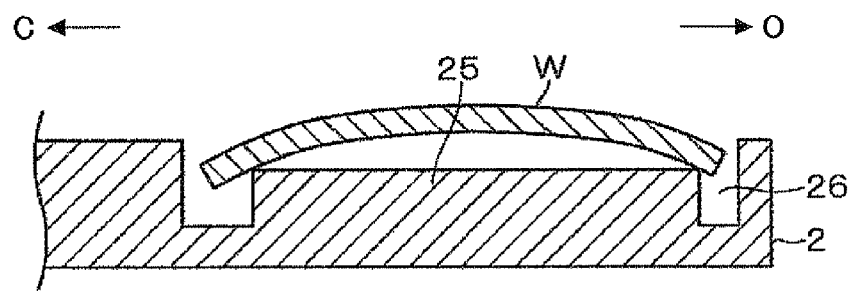
FIG. 13 is a vertical cross-sectional view showing an operation of the turntable of the embodiment.

At this time, the turntable 2 is previously heated by the heater unit 7 in order to have the wafers W mounted on the turntable 2 to be the film deposition temperature of, about 300° C., for example. First, the gate valve G is opened and five wafers W are mounted on the turntable 2 via a transfer arm, not shown in the drawings, via the transfer port 15 while transmittedly rotating the turntable 2. These wafers W are respectively mounted on the center portions of the concave portions 24. Thus, each of the wafers W is mounted to be apart from (not being in contact with) the inner peripheral surface of the concave portion 24 along the circumferential direction. At this time, each of the wafers W is at a room temperature or is in a state warped upward based on the in-plane temperature variation when the wafer W is mounted on the turntable 2 as being previously heated by another heat treatment, as shown in FIG. 13.

Figure 14:
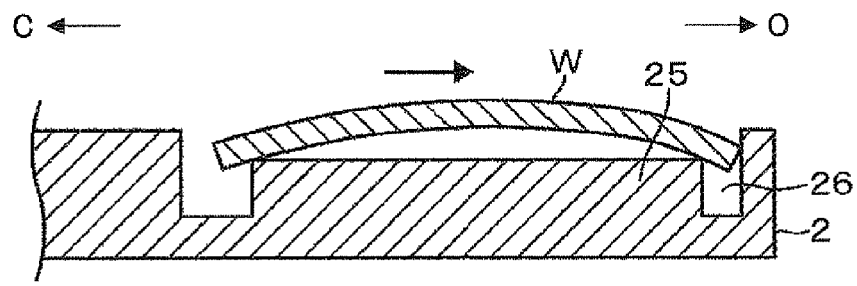
FIG. 14 is a vertical cross-sectional view showing the operation of the turntable of the embodiment.

Next, the gate valve G is closed, the vacuum chamber 1 is evacuated to ultimate pressure by the vacuum pump 64, and the turntable 2 is rotated in the clockwise direction (in a direction shown by an arrow A in the drawings) at 2 rpm to 240 rpm, for example. As shown in FIG. 14, each of the wafers W moves toward the outer peripheral portion side O of the turntable 2 within the concave portion 24 by centrifugal force of the turntable 2. At this time, as the turntable 2 is rotated before the temperature of the wafer W reaches the film deposition temperature, when the wafer W is warped, the wafer W moves toward the outer peripheral portion side O before being flattened (at the warped state). However, when the wafer W moves, the outer edge of the wafer W is apart from the surface of the turntable 2 or the surface of the mounting table 25, the generation of the particles by sliding between the outer edge and the mounting table 25 can be suppressed.

Figure 15:
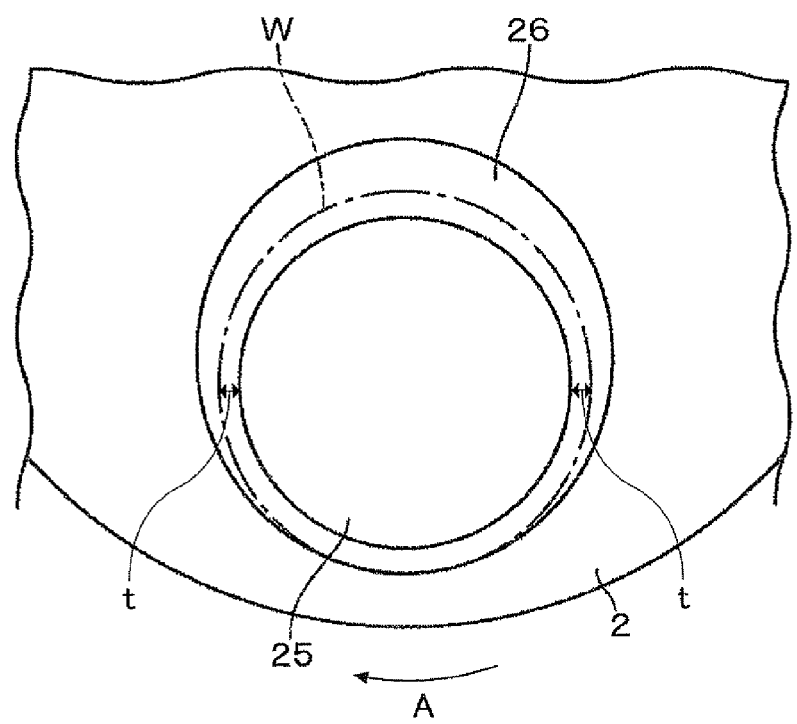
FIG. 15 is a plan view showing the operation of the turntable of the embodiment.

Here, when the turntable 2 is rotated from the static state, each of the wafers W tends to remain static and move to a backward side of the rotational direction of the turntable 2 (an opposite direction of the rotation direction of the turntable 2). However, the wafer W is pushed by centrifugal force such that the outer edge of the wafer W contacts the inner peripheral surface of the concave portion 24 at the outer peripheral portion side O of the turntable 2, the position of the wafer W in the rotational direction of the turntable 2 is regulated by the concave portion 24 and the centrifugal force. As a result, as shown in FIG. 15, the ejected amounts "t" at both side of the rotational direction A become equal. Thus, when the wafer W is rotated by the turntable 2, the ejected amount "t" becomes 1 mm to 2 mm along the circumferential direction.

Figure 16:
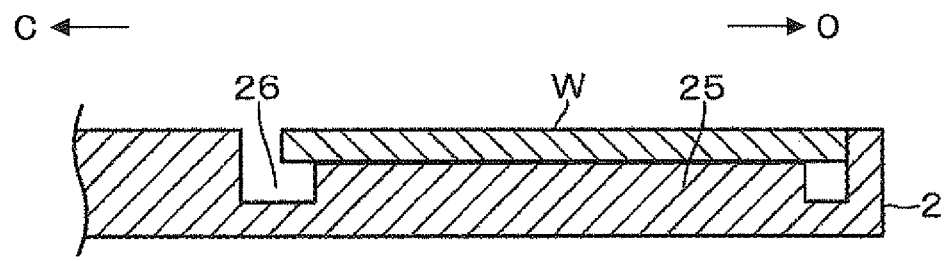
FIG. 16 is a vertical cross-sectional view showing the operation of the turntable of the embodiment.

Then, while performing the deposition process, which will be explained later, or before starting supplying each of the process gasses, the wafers W are gradually heated to the film deposition temperature by the heat of the turntable 2, and thereafter, the in-plane film deposition temperature becomes equal. Thus, even when the wafer W is warped upward, the wafer W becomes flattened as shown in FIG. 16. At this time, when the wafer W is flattened, the outer edge of the wafer W moves to be extend outward. However, as the outer edge of the wafer W is apart from the mounting table 25, the generation of the particles can be suppressed.

Figure 17:
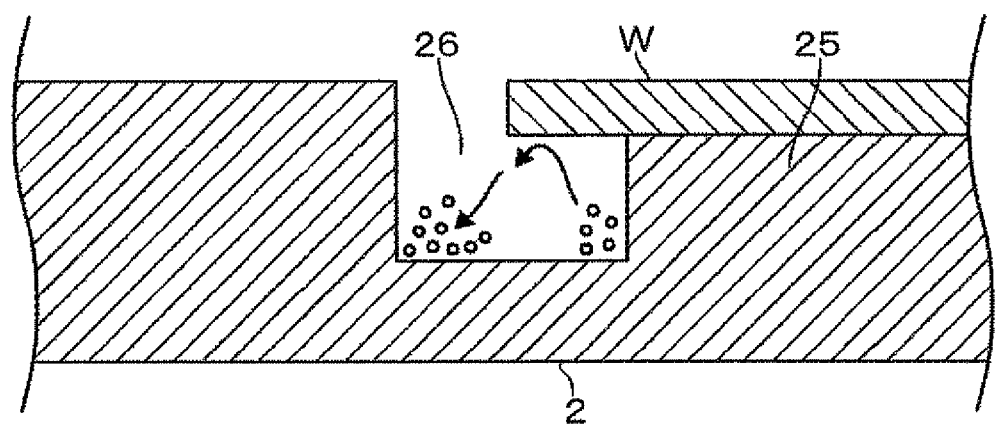
FIG. 17 is a vertical cross-sectional view showing the operation of the turntable of the embodiment.
Figure 18:
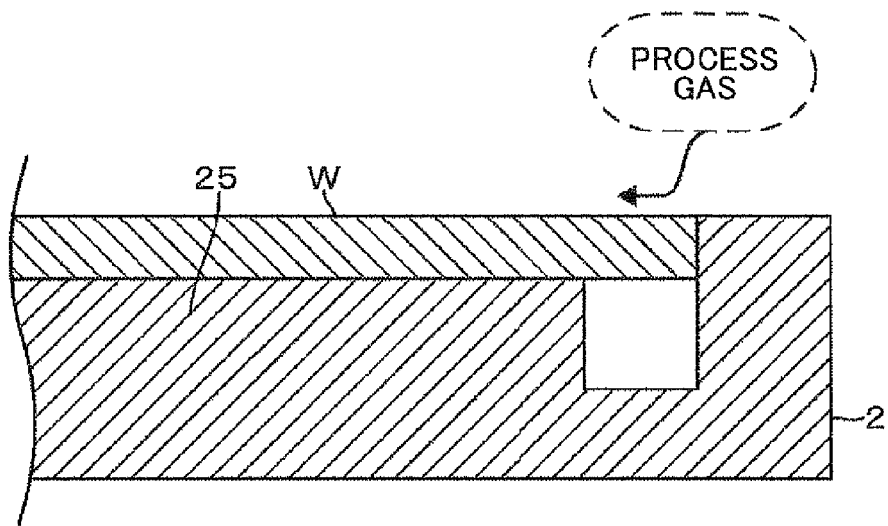
FIG. 18 is a vertical cross-sectional view showing the operation of the turntable of the embodiment.

At this time, particles are generated as the back surface of the wafer W and the front surface of the mounting table 25 rub with each other when the wafer W moves toward the outer peripheral portion side O of the turntable 2 by centrifugal force of the turntable 2. As shown in FIG. 17, however, when seen from the particles at the back surface side of the wafer W, the outer edge of the wafer W is horizontally protruded along the circumferential direction for a length as long as 1 mm to 2 mm. Thus, the particles do not tend to pass through the outer edge of the wafer W so that the adhesion of the particles to the front surface side of the wafer W can be suppressed.

Then, the first process gas and the second process gas are discharged from the process gas nozzles 31 and 32, respectively, and the plasma generation gas is discharged from the plasma generation gas nozzle 34. Further, the separation gasses are discharged from the separation gas nozzles 41 and 42 at a predetermined flow rate, respectively, and nitrogen gas is discharged from the separation gas supplying pipe 51 and the purge gas supplying pipe 72 at a predetermined flow rate, respectively. Then, the vacuum chamber 1 is adjusted to a predetermined process pressure by the pressure regulator 65 and a high frequency power is supplied to the plasma generation unit 80.

At this time, although each of the process gasses supplied to the wafers W tends to pass toward the back surface side of the wafer W via a space between the outer edge of the wafer W and the inner peripheral surface of the concave portion 24, as the ejected amount "t" is set as explained above so that there is not a sufficient space for the gas to pass through at the area and the passing of the gas can be suppressed. Therefore, the adhesion of the particles to the back surface side of the wafer W can be suppressed and each of the process gasses can be evenly supplied to the surface of the wafer W. Further, by setting the ejected amount "t" as such, the temperature of the wafer W at the upper area of the mounting table 25 becomes even and the heat rapidly transmits toward the outer edge portion side via such an area so that the in-plane temperature of each of the wafers W becomes constant.

Further, the first process gas is adsorbed onto the surface of the wafer W in the first process area P1 by the rotation of the turntable 2, and the second process gas and the first process gas adsorbed on the wafer W second process area P2 react with each other at the second process area P2 to form a reaction product of a single layer or plural layers of molecular layer of silicon oxide film ($SiO_2$), which is a thin film component. At this time, impurities such as water (OH group), organic components or the like may be included in the reaction product caused from residue included in the first process gas, for example.

Meanwhile, the electric field among the electric field and the magnetic field generated by the high frequency power supplied from the high frequency power source 85 is reflected or absorbed (attenuated) by the Faraday shield 95 below the plasma generation unit 80 and prevented from entering into in the vacuum chamber 1. The magnetic field passes the slits 97 of the Faraday shield 95 to enter inside the vacuum chamber 1 via the bottom surface of the housing 90. Thus, the plasma generation gas discharged from the plasma generation gas nozzle 34, is activated by the magnetic field which has passed via the slits 97 so that plasma such as ion, radical or the like is generated.

Then, when the plasma (active species) generated by the magnetic field contacts the surface of the wafer W, the surface treatment process for the reaction product is performed. Specifically, for example, when the plasma collides with the surface of the wafer W, the impurities are discharged from the reaction product, or the elements in the reaction product are rearranged to be dense (to have high density). By continuing the rotation of the turntable 2, the adsorption of the first process gas to the surface of the wafer W, the reaction of the first process gas adsorbed on the surface of the wafer W and the plasma surface process of the reaction product are performed in this order for plural times to form a thin film of a stacked layers of the reaction product. At this time, as explained above, each of the gasses is evenly supplied to the in-plane of each of the wafers W, and as the in-plane temperature of each of the wafers W is constant, the in-plane thickness of the thin film becomes constant.

Further, as the nitrogen gas is provided between the first process area P1 and the second process area P2, the first process gas, the second process gas and the plasma generation gas are evacuated without being mixed with each other. Further, as the purge gas is supplied to the lower side of the turntable 2, the gas which tends to diffuse toward the lower side of the turntable 2 can be pushed back by the purge gas to the evacuation ports 61 and 62.

According to the above explained embodiment, as the concave portion 24 into which the wafer W is positioned and is housed is formed to be larger than the wafer W and the mounting table 25 formed to be smaller than the wafer W is provided in the concave portion 24. Then, the mounting table 25 is configured such that the center position of the mounting table 25 is off center with respect to the center position of the concave portion 24 toward the outer peripheral portion side. With this structure, when the wafer W is moved to the outer peripheral portion side of the turntable 2 by centrifugal force of the turntable 2, the outer edge of the wafer W is protruded from the upper edge of the mounting table 25 along the circumferential direction mounting table 25. Thus, the ejected amount "t" can be retained at a size capable of suppressing the particles generated at the back surface side of the wafer W passing toward the front surface side along the circumferential direction of the wafer W while suppressing a generation of a large space in which the process gas can be introduced to the back surface side of the wafer W. Therefore, the process in which the in-plane thickness of the deposited film can be highly uniformly formed can be performed while suppressing the adhesion of particles to the wafer W. Thus, even when the wafer W is warped upward, the process (rotation of the turntable 2) can be started immediately after the wafer W is mounted on the turntable 2 to suppress lowering of throughput.

Here, when the outer edge of the wafer W contacts the inner peripheral surface of the concave portion 24 by centrifugal force of the turntable 2, if the ejected amount "t" is too small, the particles tend to pass toward the front surface side of the wafer W while if the ejected amount "t" is too large, the in-plane uniformity of the film thickness becomes worse or the particles tend to adhere to the back surface of the wafer W, as described above. Thus, it is preferable that the ejected amount "t" is greater than or equal to 1 mm and less than 3 mm, and more preferably, greater than or equal to 1 mm and less than or equal to 2 mm along the circumferential direction of the wafer W.

For the example explained with reference to FIG. 5 and FIG. 6, the ejected amount "t" is set to be $t_{o2}=2$ mm and $t_{c2}=1$ mm at the outer peripheral portion side O and the center portion side C of the turntable 2, respectively, when the outer edge of the wafer W contacts the inner peripheral surface of the concave portion 24 at the point E2 by centrifugal force of the turntable 2. However, in an alternative example, the mounting table 25 may be provided such that the ejected amount of the peripheral edge portion of the wafer W from the mounting table 25 becomes equal at the center portion side C and the outer peripheral portion side O of the turntable 2 when the wafer W contacts the inner wall surface of the concave portion 24 by centrifugal force in accordance with the rotation of the turntable 2.

For example, the diameter "d" of the mounting table 25 may be shortened so that the diameter "d" of the mounting table 25, the width L1 and the width L2 become 296 mm, 4 mm and 2 mm, respectively. With this structure, the ejected amount of the peripheral edge portion of the wafer W from the mounting table 25 becomes equal to be 2 mm both at the center portion side C and the outer peripheral portion side O of the turntable 2, in other words, the ejected amount becomes equal along the circumferential direction. Here, with this structure, the ejected amount $t_{c1}$ before rotating the turntable 2 at the center portion side C becomes 3 mm (=302 mm (the diameter "R" of the concave portion 24)−296 mm (the diameter d2 of the mounting table 25)−2 mm (the distance between the concave portion 24 and the mounting table 25 at the outer peripheral portion side O)−1 mm (the clearance C1 at the center portion side C)). However, even when the ejected amount $t_{c1}$ is large before rotating the turntable 2, there is no problem such as the process gas passing through or the particles adhering to the back surface side at the outer edge.

Further, in an alternative example, the ejected amount of the peripheral edge portion of the wafer W from the mounting table 25 may be 1.5 mm at both of the center portion side C and the outer peripheral portion side O of the turntable 2, in other words, the ejected amount may be equal along the circumferential direction by the following structure. For this case, the diameter "d" of the mounting table 25 is retained at 297 mm and the center position O2, shown in FIG. 6, of the mounting table 25 is further shifted with respect to the concave portion 24 toward the outer peripheral portion side O so that the distance d1 between the center position O2 of the mounting table 25 and the center position O1 of the concave portion 24 are 1 mm, for example. At this time, when the wafer W contacts the inner wall surface of the concave portion 24 by centrifugal force in accordance with the rotation of the turntable 2, the ejected amount of the peripheral edge portion of the wafer W from the mounting table 25 may be 1.5 mm at both of the center portion side C and the outer peripheral portion side O. According to the above description, the distance d1 between the center position O2 of the mounting table 25 and the center position O1 of the concave portion 24 shown in FIG. 6 may be, for example, greater than or equal to 0.5 mm and less than or equal to 1 mm.

Figure 19:
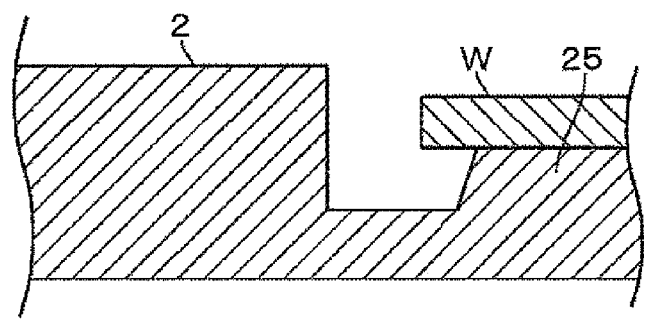
FIG. 19 is a vertical cross-sectional view showing a part of another example of the substrate processing apparatus of the embodiment.
Figure 20:
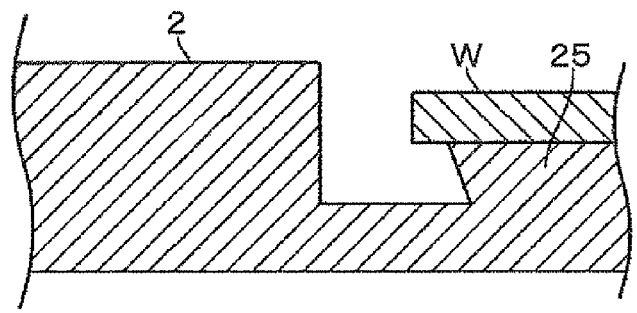
FIG. 20 is a vertical cross-sectional view showing a part of another example of the substrate processing apparatus of the embodiment.

Other examples of the substrate processing apparatus are explained. FIG. 19 shows an example in which the mounting table 25 is formed such that the diameter "d" becomes larger from the upper end side to the lower end side. FIG. 20 shows an example in which the mounting table 25 is formed such that the diameter "d" becomes smaller from the upper surface to the lower surface. For the examples shown in FIG. 19 and FIG. 20 as well, the ejected amount t of the wafer W is set similarly as explained above.

Figure 21:
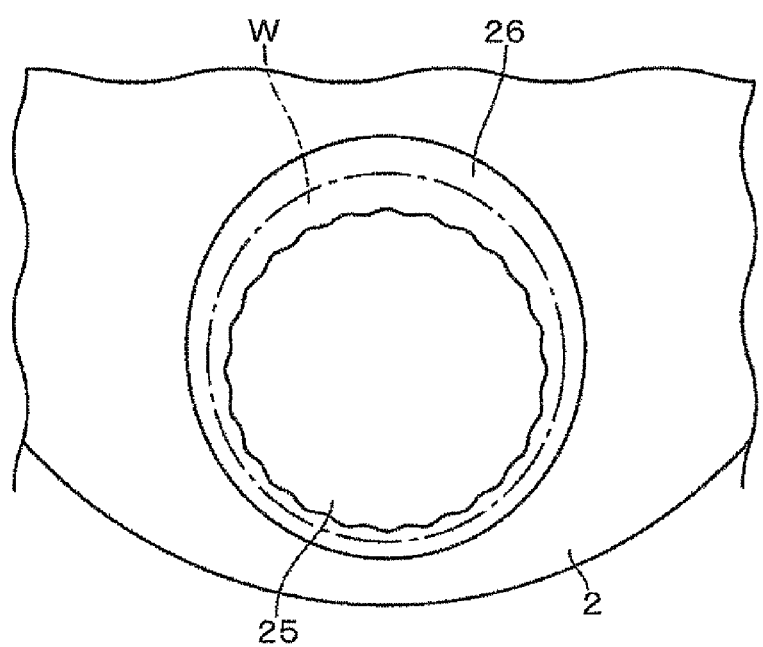
FIG. 21 is a plan view showing a part of another example of the substrate processing apparatus of the embodiment.

Further, FIG. 21 shows an example in which the outer peripheral surface of the mounting table 25 is provided with a convexo-concave structure instead of being formed to be a concentric circle with the wafer W in a plan view. Even at this time as well, the ejected amount "t" is set within the same range as explained above along the circumferential direction of the wafer W. Further, the diameter "R" of the concave portion 24 is formed to be one size larger than the wafer W. Specifically, the diameter "R" of the concave portion 24 is formed to be about 1 mm to 2 mm larger than the diameter "r" of the wafer W. Thus, the diameter "d" of the mounting table 25 and the widths L1 and L2 are appropriately set such that the ejected amount "t" becomes within the above described range in accordance with the diameter "R" of the concave portion 24. Further, in each of the above examples, the center positions O1 and O2 of the concave portion 24 and the mounting table 25, respectively, are formed to be aligned on the radius direction of the turntable 2. However, alternatively, the center position O2 may be slightly shifted with respect to the center position O1 in the circumferential direction of the turntable 2 as well as shifted toward the outer peripheral portion side. In such a case as well, the ejected amount "t" when the outer edge of the wafer W contacts the inner wall surface of the concave portion 24 by centrifugal force of the turntable 2 is set to be within a predetermined range as described above.

Further, for the deposition process in the substrate processing apparatus, reaction products as shown in the following table 1 in addition to the above described silicon oxide film may be deposited. In table 1, an example of process gasses to be used in the deposition process is shown at a right side of each of the reaction products. Further, in Table 1, kinds of gasses different from those explained above are shown.

TABLE 1

| REACTION PRODUCT | FIRST PROCESS GAS | SECOND PROCESS GAS |
|---|---|---|
| TiN film | TiCl$_4$ gas | Ammonia (NH$_3$) gas |
| High-k film (ZrO film) | Tetrakis(ethylmethylamino) zirconium (TEMAZ) gas | Ozone gas |
| High-k film (Al$_2$O$_3$ film) | Tri-methyl aluminum (TMA) gas | Ozone gas |
| SiN film | Dichlorosilane (DCS) gas Trichlorosilane (SiHCl$_3$) gas | Ammonia (NH$_3$) gas |
| Silicon oxide film | Diisopropyl aminosilane (DIPAS) gas | Ozone gas |
| | Tri-dimethyl aminosilane (3DMAS) gas | Ozone gas |

Thus, different kinds of gas may be used as the plasma generation gas in accordance with the kinds of the reaction product.

Figure 22:
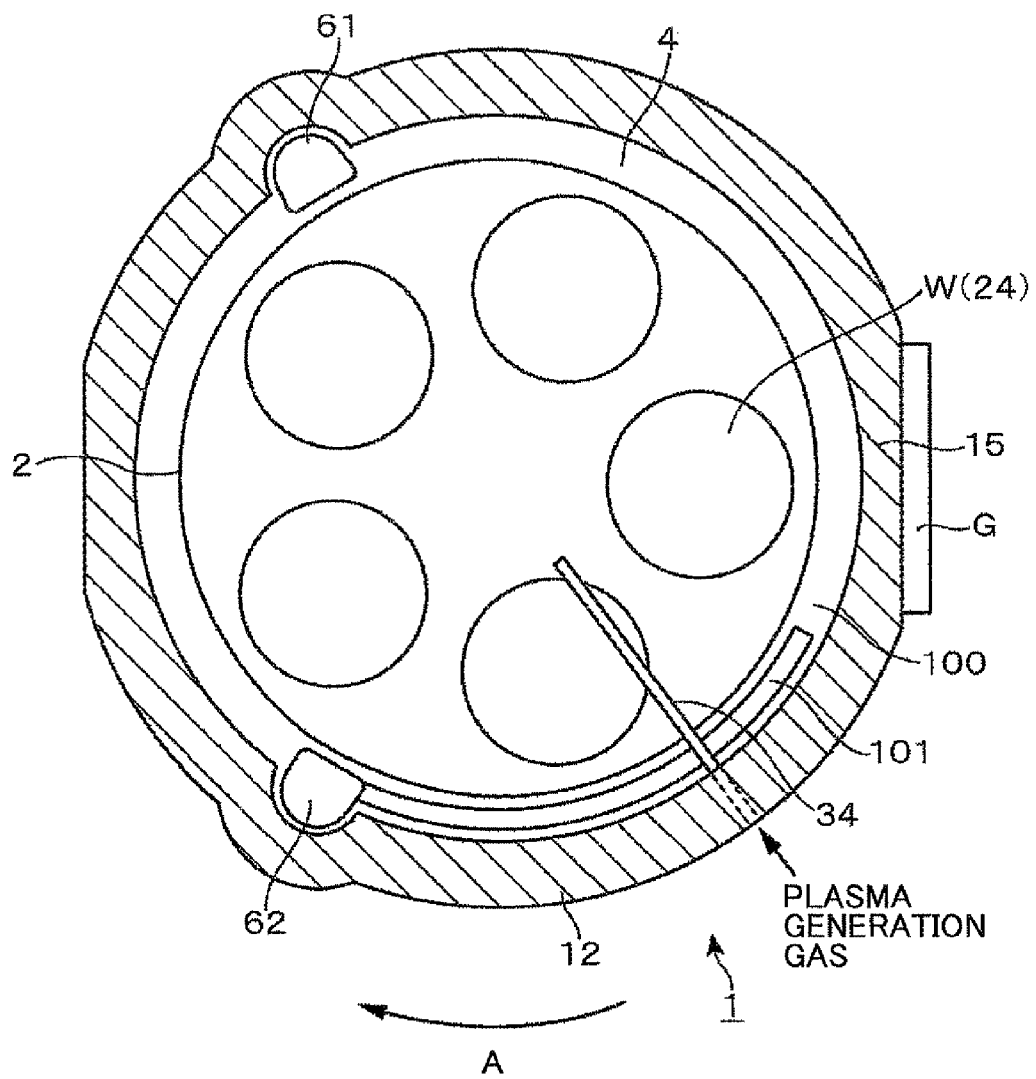
FIG. 22 is a lateral cross-sectional view showing another example of the substrate processing apparatus of the embodiment.

Further, an example of the substrate processing apparatus in which the plasma surface treatment process is performed with the deposition process is described above. However, alternatively, the plasma process may be performed on the wafers W to which the deposition process is already performed. In this case, as shown in FIG. 22, the surface treatment process for the thin films formed on the wafers W, respectively, is performed by rotating the turntable 2 around the vertical axis while plasma activating the process gas (plasma generation gas) discharged from the plasma generation gas nozzle 34. For such a substrate processing apparatus, the adhesion of the particles to the wafer W is suppressed and the passing through of the plasma generation gas to the back surface side of the wafer W can be suppressed so that the plasma process can be performed with a high in-plane uniformity.

Although an example where the turntable 2 is made of quartz is shown above, the turntable 2 may be made of carbon (C), Silicon Carbide (SiC), aluminium (Al) or the like instead of quartz. Further, an example where the turntable 2 is rotated in the clockwise direction is shown above, the turntable 2 may be rotated in an anti-clockwise direction.

EXAMPLE

Figure 23:
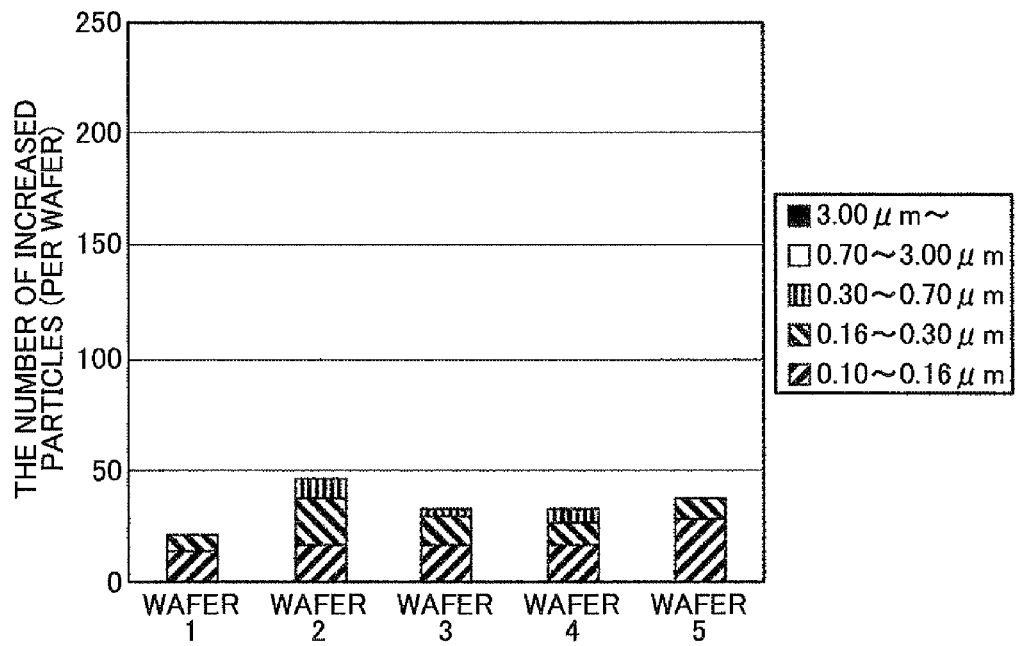
FIG. 23 is a view showing a characteristic obtained in an example of the embodiment.

When the deposition process is performed on wafers 1 to 5, respectively, using the substrate processing apparatus shown in FIG. 1, as referred to in the following Table 2 and shown in FIG. 23, particles adhered to the wafers 1 to 5 are extremely small.

TABLE 2

| (example) | | | | | |
|---|---|---|---|---|---|
| | WAFER 1 | WAFER 2 | WAFER 3 | WAFER 4 | WAFER 5 |
| 0.10~0.16 μm | 13 | 15 | 16 | 15 | 27 |
| 0.16~0.30 μm | 7 | 21 | 12 | 10 | 9 |
| 0.30~0.70 μm | 0 | 9 | 3 | 7 | 1 |
| 0.70~3.00 μm | 0 | 0 | 0 | 0 | 0 |
| 3.00 μm~ | 0 | 0 | 0 | 0 | 0 |
| TOTAL | 20 | 45 | 31 | 32 | 37 |
| | | | | AVERAGE | 31 |

Figure 24:
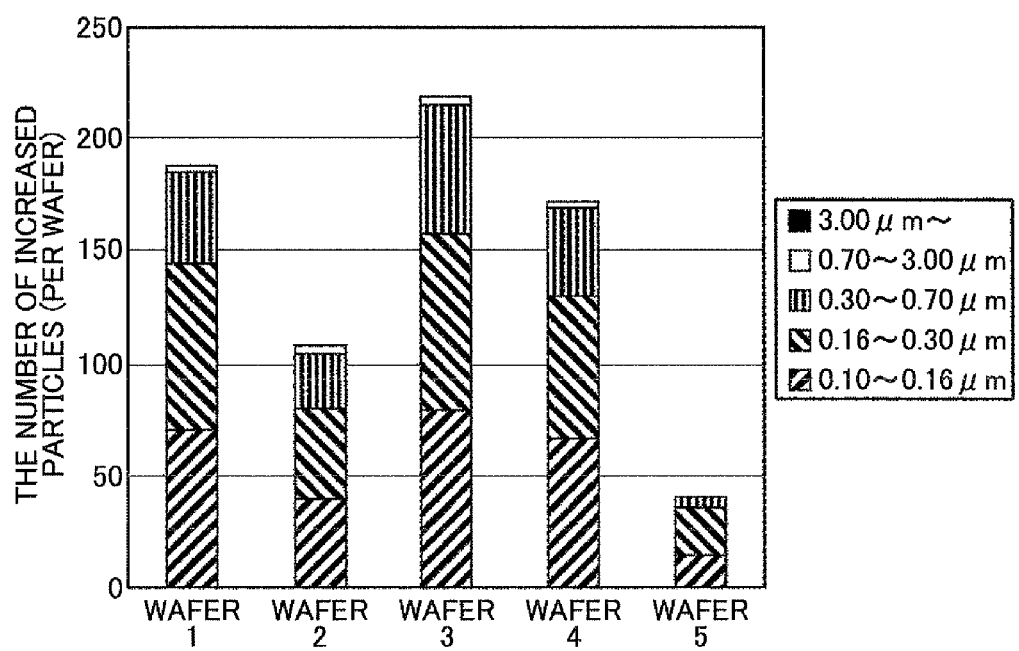
FIG. 24 is a view showing a characteristic obtained in a relative example.

On the other hand, when the same deposition process is performed by using the turntable 2 shown in FIG. 7 and FIG. 8 (relative example 1), as referred to in the following Table 3 and shown in FIG. 24, particles adhered to the surface of wafers 1 to 5 are increased.

TABLE 3

| (relative example 1) | | | | | |
|---|---|---|---|---|---|
| | WAFER 1 | WAFER 2 | WAFER 3 | WAFER 4 | WAFER 5 |
| 0.10~0.16 μm | 70 | 40 | 79 | 66 | 13 |
| 0.16~0.30 μm | 74 | 40 | 78 | 63 | 22 |
| 0.30~0.70 μm | 41 | 23 | 57 | 40 | 4 |
| 0.70~3.00 μm | 3 | 4 | 4 | 3 | 0 |
| 3.00 μm~ | 0 | 0 | 0 | 0 | 0 |
| TOTAL | 188 | 107 | 218 | 172 | 39 |
| | | | | AVERAGE | 145 |

The result for the turntable 2 of FIG. 9 (relative example 2) is referred to in Table 4 and shown in FIG. 25. The particles adsorbed onto the front surface of each of the wafers 1 to 5 are reduced compared with those in the example.

TABLE 4

| (relative example 2) | | | | | |
|---|---|---|---|---|---|
| | WAFER 1 | WAFER 2 | WAFER 3 | WAFER 4 | WAFER 5 |
| 0.10~0.16 μm | 2 | 2 | 0 | 2 | 0 |
| 0.16~0.30 μm | 0 | 0 | 0 | 4 | 9 |
| 0.30~0.70 μm | 6 | 3 | 2 | 5 | 7 |
| 0.70~3.00 μm | 2 | 0 | 0 | 3 | 0 |
| 3.00 μm~ | 0 | 0 | 0 | 0 | 0 |
| TOTAL | 10 | 5 | 2 | 14 | 16 |
| | | | | AVERAGE | 9 |

However, for the particles adhered to the back surface side of the wafer W, as referred to in the following Table 5 and shown in FIG. 26, the amount was increased for relative example 2 compared with the example.

TABLE 5

|  | RELATIVE EXAMPLE 1-1 | RELATIVE EXAMPLE 1-2 | RELATIVE EXAMPLE 1-1 | RELATIVE EXAMPLE 1-2 | RELATIVE EXAMPLE 2-1 | RELATIVE EXAMPLE 2-2 |
|---|---|---|---|---|---|---|
| 0.10~0.16 μm | 72 | 96 | 114 | 122 | 140 | 96 |
| 0.16~0.30 μm | 72 | 92 | 128 | 91 | 278 | 359 |
| 0.30~0.70 μm | 67 | 65 | 120 | 87 | 99 | 115 |
| 0.70~3.00 μm | 4 | 2 | 10 | 3 | 4 | 6 |
| 3.00 μm~ | 43 | 75 | 21 | 34 | 67 | 80 |
| TOTAL | 258 | 330 | 393 | 337 | 588 | 656 |
| AVERAGE | 294 | | 365 | | 622 | |

Further, Table 6 shows a summary of the particles at the front surface and the back surface of the wafers 1 to 5, as explained above, and the in-plane uniformity of the thin films formed on the wafers 1 to 5.

TABLE 6

|  | IN-PLANE UNIFORMITY | PARTICLES AT FRONT | PARTICLES AT BACK |
|---|---|---|---|
| EXAMPLE | 2.1% | 31 | 294 |
| RELATIVE EXAMPLE 1 | 2.0% | 145 | 365 |
| RELATIVE EXAMPLE 2 | 2.3% | 9 | 622 |

As can be understood from Table 6, according to the embodiment, the high uniformity can be retained for the thickness of the thin film and the adhesion of the particles can be suppressed.

According to the embodiment, a mounting table for mounting a substrate is provided at a bottom surface of a concave portion formed at a front surface of a turntable to have a larger diameter than that of the substrate where the mounting table is configured such that the peripheral edge portion of the substrate is protruded from the mounting table when the substrate contacts the inner wall surface of the concave portion by centrifugal force in accordance with the rotation of the turntable along the entire perimeter. Then, the center of the mounting table is off center with respect to the center of the concave portion toward the outer peripheral portion side of the turntable. Thus, even when the substrate is moved by centrifugal force, the ejected amount of the peripheral edge portion of the substrate from the mounting table along the circumferential direction of the substrate can be set within a size capable of suppressing the passing through of the particles generated at the back surface side of the substrate to the front surface side while suppressing the generation of a large space at the back surface side of the substrate in which the process gas can be introduced. Therefore, even when the substrate is warped upward, the rotation of the substrate can be started immediately after the substrate is mounted on the turntable to suppress lowering of throughput, and the in-plane process uniformity can be retained while the adhesion of the particles to the substrate can be suppressed Although a preferred embodiment of the substrate processing apparatus has been specifically illustrated and described, it is to be understood that minor modifications may be made therein without departing from the spirit and scope of the invention as defined by the claims.

The present invention is not limited to the specifically disclosed embodiments, and variations and modifications may be made without departing from the scope of the present invention.

What is claimed is:

1. A substrate processing apparatus comprising: a vacuum chamber; a turntable rotatably provided in the vacuum chamber, on which a circular substrate is to be mounted, and provided with a circular concave portion at a front surface having a larger diameter than that of the substrate, and a circular substrate mounting portion provided in the circular concave portion having a diameter smaller than that of the circular concave portion and the substrate and protruding from a bottom portion of the circular concave portion so as to mount the substrate at a position higher than the bottom portion of the circular concave portion; a process gas supplying unit which supplies a process gas to the substrate; and a vacuum evacuation mechanism which evacuates the vacuum chamber, wherein the substrate mounting portion has the diameter smaller than that of the substrate and is off center with respect to the center of the circular concave portion toward an outer peripheral portion side of the turntable such that an entire perimeter of a peripheral edge portion of the substrate is protruded from the substrate mounting portion when the substrate contacts an inner wall surface of the circular concave portion by centrifugal force in accordance with the rotation of the turntable, and wherein the turntable is configured to have only one substrate mounting portion in the circular concave portion, said substrate mounting portion having an outer periphery including an upper end and a lower end, said upper end of the outer periphery having a diameter larger than that of the lower end of the outer periphery.

2. The substrate processing apparatus according to claim 1,
wherein the substrate mounting portion is configured such that an ejected amount of the peripheral edge portion of the substrate from the substrate mounting portion is greater than or equal to 1 mm and less than 3 mm along the circumferential direction of the substrate when the substrate contacts the inner wall surface of the circular concave portion by centrifugal force in accordance with the rotation of the turntable.

3. The substrate processing apparatus according to claim 1,
wherein the center of the circular concave portion and the center of the substrate mounting portion are positioned to be apart from each other along a radius direction of the turntable.

4. The substrate processing apparatus according to claim 1, further comprising:
a heater mechanism for heating the substrate mounted on the substrate mounting portion, and
wherein the process gas is for depositing a thin film on the substrate.

5. The substrate processing apparatus according to claim 1, wherein the substrate mounting portion is configured such that an ejected amount of the peripheral edge portion of the substrate from the substrate mounting portion at a center portion side of the turntable when the substrate is mounted on the substrate mounting portion such that clearances between the circular concave portion and the substrate at the center portion side and the outer peripheral portion side, respectively, of the turntable become equal before the turntable is being rotated, and an ejected amount of the peripheral edge portion of the substrate from the substrate mounting portion at the outer peripheral portion side of the turntable when the substrate contacts the inner wall surface of the circular concave portion by centrifugal force in accordance with the rotation of the turntable become equal.

6. The substrate processing apparatus according to claim 1, wherein the substrate mounting portion is configured such that ejected amounts of peripheral edge portions of the substrate from the substrate mounting portion at a center portion side and the outer peripheral portion side of the turntable, respectively, become equal when the substrate contacts the inner wall surface of the circular concave portion by centrifugal force in accordance with the rotation of the turntable.

7. The substrate processing apparatus according to claim 1, wherein the substrate mounting portion is configured such that a front surface of the substrate and the front surface of the turntable become equal height when the substrate is mounted on the substrate mounting portion.

8. The substrate processing apparatus according to claim 1, wherein the substrate mounting portion has a tapered lateral surface along an entire perimeter of the substrate mounting portion.

9. The substrate processing apparatus according to claim 1, wherein the substrate mounting portion has the outer periphery having a plurality of convexo-concave structures along a circumferential surface.

10. The substrate processing apparatus according to claim 1, wherein the substrate mounting portion is off center with respect to the center of the circular concave portion in a direction of the centrifugal force of the turntable.

* * * * *